United States Patent
Fann

(10) Patent No.: US 7,960,679 B2
(45) Date of Patent: Jun. 14, 2011

(54) PHOTO DETECTOR ARRAY WITH THIN-FILM RESISTOR-CAPACITOR NETWORK FOR USE WITH A DISPLAY DEVICE

(75) Inventor: Sen-Shyong Fann, Hsinchu (TW)

(73) Assignee: Integrated Digital Technologies, Inc., Hsinchu (TW)

( * ) Notice: Subject to any disclaimer, the term of this patent is extended or adjusted under 35 U.S.C. 154(b) by 0 days.

(21) Appl. No.: 11/777,887

(22) Filed: Jul. 13, 2007

(65) Prior Publication Data

US 2008/0087796 A1 Apr. 17, 2008

Related U.S. Application Data

(63) Continuation-in-part of application No. 11/534,680, filed on Sep. 25, 2006, now Pat. No. 7,525,078.

(51) Int. Cl.
*H01J 40/14* (2006.01)
*H01L 27/00* (2006.01)

(52) U.S. Cl. ................. 250/214 R; 250/208.1

(58) Field of Classification Search ............... 250/208.1, 250/214.1, 214 R; 345/92, 157, 158, 173–175; 257/428, 431, 443, 444; 349/42; 178/18.01, 178/18.03, 18.09
See application file for complete search history.

(56) References Cited

U.S. PATENT DOCUMENTS

| | | | |
|---|---|---|---|
| 4,684,801 A | 8/1987 | Carroll et al. | |
| 4,988,983 A * | 1/1991 | Wehrer | ........................... 345/175 |
| 5,262,635 A | 11/1993 | Curbelo | |
| 5,705,807 A | 1/1998 | Throngnumchai et al. | |
| 6,046,466 A | 4/2000 | Ishida | |
| 6,081,558 A | 6/2000 | North | |
| 6,350,981 B1 | 2/2002 | Uno | |
| 6,512,547 B1 | 1/2003 | Miida | |
| 6,947,102 B2 | 9/2005 | den Boer et al. | |
| 7,002,547 B2 * | 2/2006 | Yamada | ........................ 345/102 |
| 7,023,503 B2 | 4/2006 | den Boer | |
| 7,030,360 B2 * | 4/2006 | Shimizu et al. | ......... 250/214 RC |

(Continued)

FOREIGN PATENT DOCUMENTS

CN 1527254 9/2004

(Continued)

OTHER PUBLICATIONS

Abileah et al., "Integrated Optical Touch Panel in a 14.1" AMLCD; SID 04 Digest (2004), 59.3, 1544-1547.

(Continued)

*Primary Examiner* — Que T Le
*Assistant Examiner* — Pascal M Bui-Pho
(74) *Attorney, Agent, or Firm* — Finnegan, Henderson, Farabow, Garrett & Dunner, LLP

(57) ABSTRACT

A photo detector device configured for use with a display device, the photo detector device comprising a photosensitive transistor formed on a substrate of the display device, the photosensitive transistor being capable of detecting an optical signal and converting the optical signal into a current signal, and a converter formed on the substrate of the display device, the converter being capable of receiving the current signal on a first conductive line and converting the current signal into a voltage signal, the converter comprising a first resistive device coupled between the first conductive line and a reference voltage line, and a first capacitive device coupled in parallel with the first resistive device between the first conductive line and the reference voltage line.

27 Claims, 21 Drawing Sheets

U.S. PATENT DOCUMENTS

| | | | |
|---|---|---|---|
| 7,184,009 B2 * | 2/2007 | Bergquist | 345/90 |
| 2003/0111604 A1 * | 6/2003 | Quek | 250/338.1 |
| 2003/0156087 A1 | 8/2003 | Boer et al. | |
| 2003/0156230 A1 | 8/2003 | Boer et al. | |
| 2005/0200296 A1 | 9/2005 | Naugler et al. | |
| 2006/0262055 A1 * | 11/2006 | Takahara | 345/81 |
| 2006/0267948 A1 * | 11/2006 | Takahashi | 345/168 |
| 2006/0274056 A1 * | 12/2006 | Saravanan et al. | 345/175 |
| 2007/0257890 A1 * | 11/2007 | Hotelling et al. | 345/173 |

FOREIGN PATENT DOCUMENTS

| | | |
|---|---|---|
| EP | 0679869 | 11/1995 |
| EP | 1195576 | 6/2008 |
| JP | 04-013360 | 1/1992 |
| JP | 6-11645 | 1/1994 |
| JP | 2000-162041 | 6/2000 |
| KR | 2001-0004005 | 1/2001 |

OTHER PUBLICATIONS

Destura et al., "Novel Touch Sensitive In-Cell AMLCD"; SID 04 Digest (2004), 3.5, 22-23.

* cited by examiner

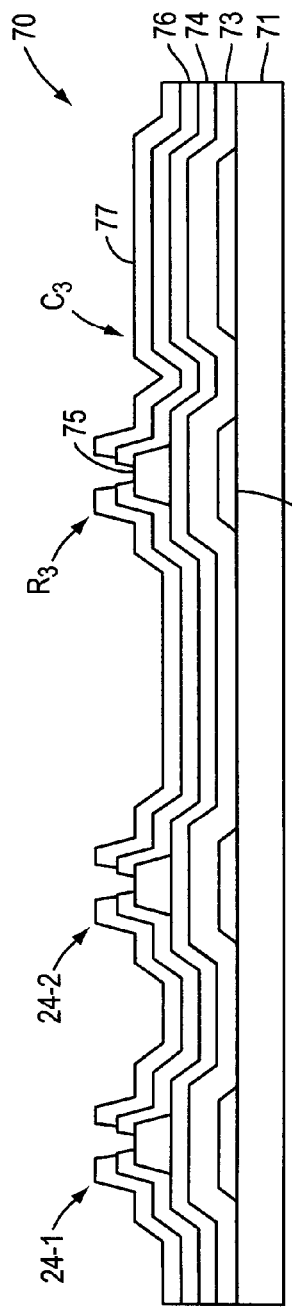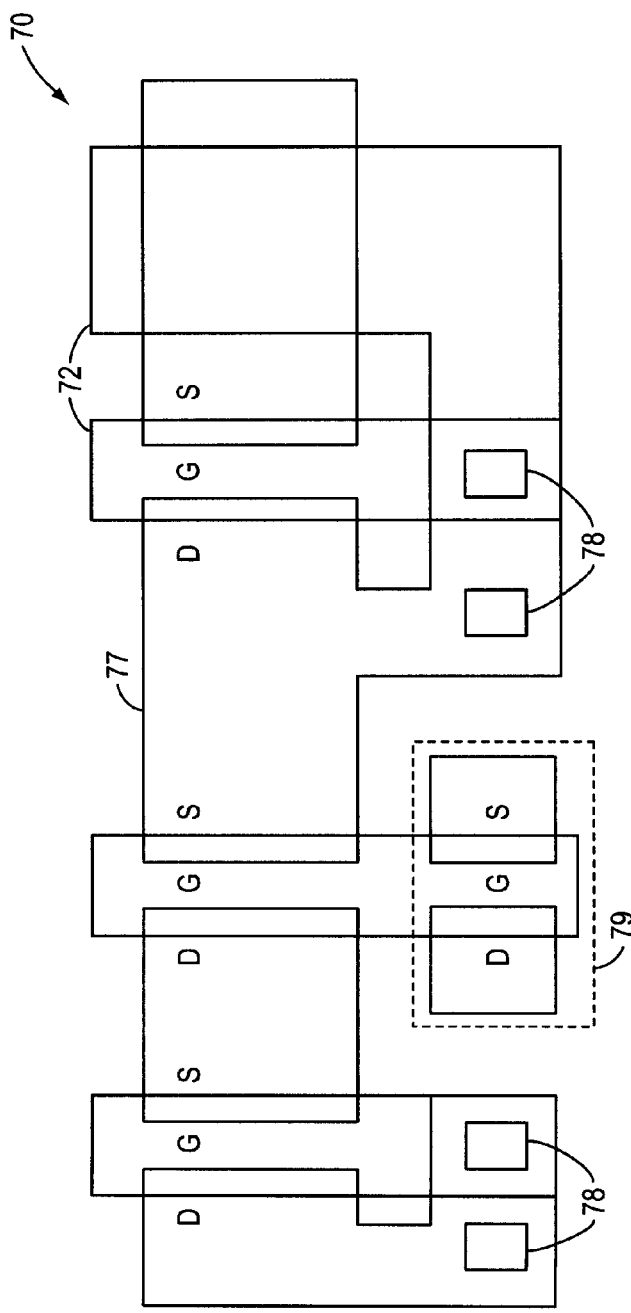
FIG. 7A
FIG. 7B

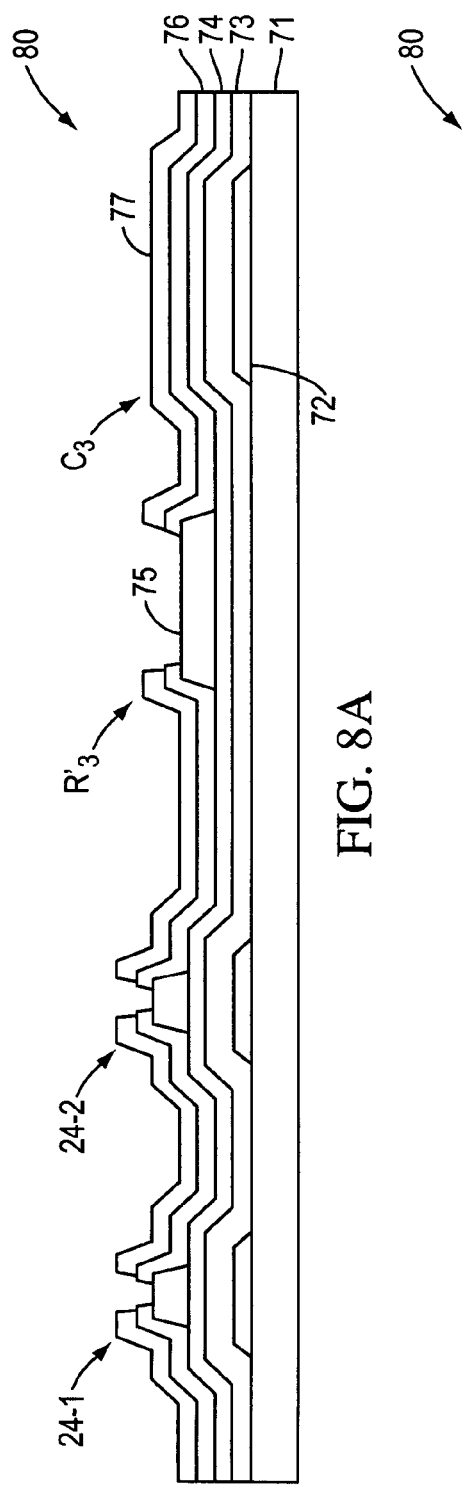
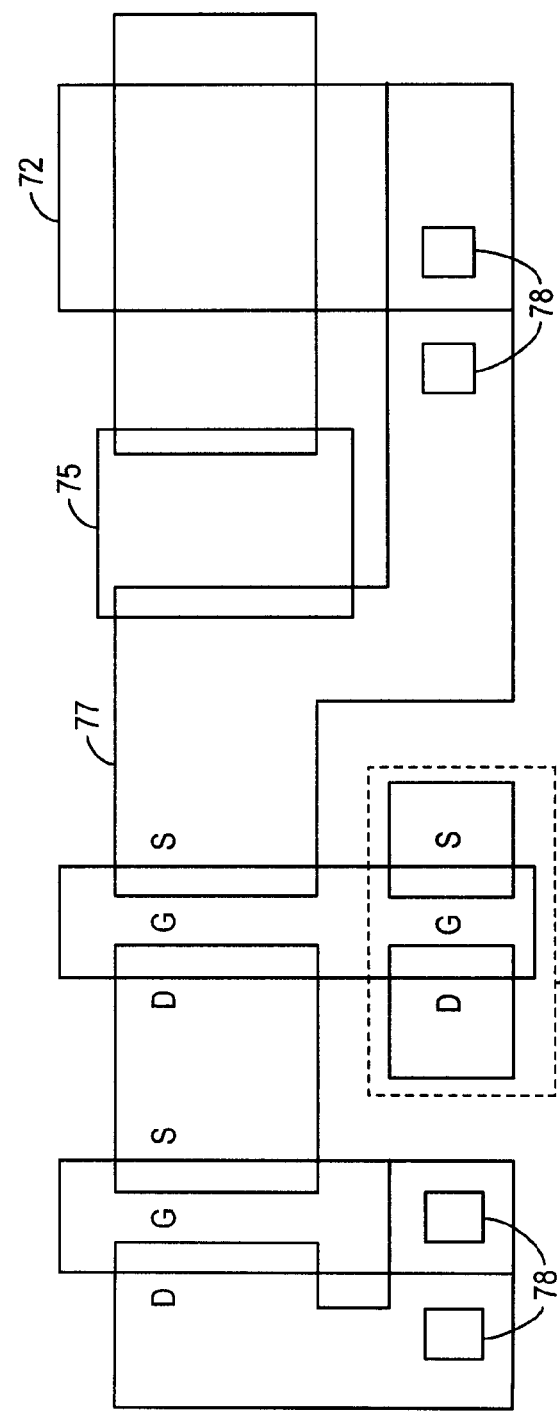
FIG. 8A
FIG. 8B

PHOTO DETECTOR ARRAY WITH THIN-FILM RESISTOR-CAPACITOR NETWORK FOR USE WITH A DISPLAY DEVICE

CROSS-REFERENCE TO RELATED APPLICATIONS

This application is a continuation-in-part of U.S. patent application Ser. No. 11/534,680, filed Sep. 25, 2006.

BACKGROUND OF THE INVENTION

The present invention relates generally to an image sensor, and more particularly, to a photo detector device capable of detecting an image input from a stylus, pen, torch or a shadow.

With the rapid development in the high-tech industry, pen tablets have been widely applicable to Personal Digital Assistants (PDAs), Personal Computers (PCs) and other electrical appliances used in our daily life. Generally, a pen tablet includes one of a resistor-type, electromagnetic inductance-type, capacitor-type and optoelectronic-type writing panel. As an example of a conventional optoelectronic-type pen tablet, an optical signal may be converted into electrical charges, which in turn may be stored in a capacitor of a detector array including capacitors, optoelectronic components and switch transistors before it is subsequently read. The capacitors may require additional areas and therefore adversely reduce the aperture ratio of the panel. Furthermore, the charges generated by a background light source and an input signal may be stored in the capacitor, adversely resulting in a relatively narrow dynamic range. It may therefore be desirable to have a photo detector device that is able to convert an optical signal into a photocurrent, thereby eliminating the storing capacitors used in the conventional panels. It may also be desirable to have a photo detector device of which the photosensitive transistors and associated circuits may be fabricated simultaneously with the thin film transistors of a liquid crystal display (LCD) device.

BRIEF SUMMARY OF THE INVENTION

Examples of the invention may provide a photo detector device configured for use with a display device, the photo detector device comprising a photosensitive transistor formed on a substrate of the display device, the photosensitive transistor being capable of detecting an optical signal and converting the optical signal into a current signal, and a converter formed on the substrate of the display device, the converter being capable of receiving the current signal on a first conductive line and converting the current signal into a voltage signal, the converter comprising a first resistive device coupled between the first conductive line and a reference voltage line, and a first capacitive device coupled in parallel with the first resistive device between the first conductive line and the reference voltage line.

Examples of the invention may also provide a photo detector device configured for use with a display device, the photo detector device comprising a plurality of first conductive lines extending in parallel with each other, a plurality of second conductive lines extending in parallel with each other and being orthogonal to the plurality of first conductive lines, an array of photosensitive transistors formed on a substrate of the display device, each of the photosensitive transistors being disposed near one of the plurality of first conductive lines and one of the plurality of the second conductive lines and being capable of detecting an optical signal and converting the optical signal into a current signal, and an array of converters formed on the substrate of the display device, each of the converters being capable of receiving the current signal on one of the first conductive lines, converting the current signal into a voltage signal, and comprising a first resistive device coupled between the first conductive line and a reference voltage line, and a first capacitive device coupled in parallel with the first resistive device between the first conductive line and the reference voltage line.

Some examples of the invention may also provide a photo detector device configured for use with a display device, the photo detector device comprising a photosensitive transistor formed on a substrate of the display device, the photosensitive transistor being capable of detecting an optical signal and converting the optical signal into a current signal, a switching transistor formed on the substrate of the display device, the switching transistor being capable of driving the photosensitive transistor and being disposed near an intersection of a first conductive line and a second conductive line, the first conductive line and the second conductive line being orthogonal to one another, and a converter formed on the substrate of the display device, the converter being capable of receiving the current signal on the first conductive line and converting the current signal into a voltage signal, the converter comprising a first resistive device coupled between the first conductive line and a reference voltage line, and a first capacitive device coupled in parallel with the first resistive device between the first conductive line and the reference voltage line.

It is to be understood that both the foregoing general description and the following detailed description are exemplary and explanatory only and are not restrictive of the invention, as claimed.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings examples consistent with the invention. It should be understood, however, that the invention is not limited to the precise arrangements and instrumentalities shown.

In the drawings:

FIG. 7A is a cross-sectional view of portions of a photo detector array consistent with an example of the present invention;

FIG. 7B is a top view of a layout diagram of the photo detector array illustrated in FIG. 7A;

FIG. 8A is a cross-sectional view of portions of a photo detector array consistent with another example of the present invention; and FIG. 8B is a top view of a layout diagram of the photo detector array illustrated in FIG. 8A.

DETAILED DESCRIPTION OF THE INVENTION

Reference will now be made in detail to the present embodiments of the invention, examples of which are illustrated in the accompanying drawings. Wherever possible, the same reference numbers will be used throughout the drawings to refer to the same or like parts.

Figure 1A:
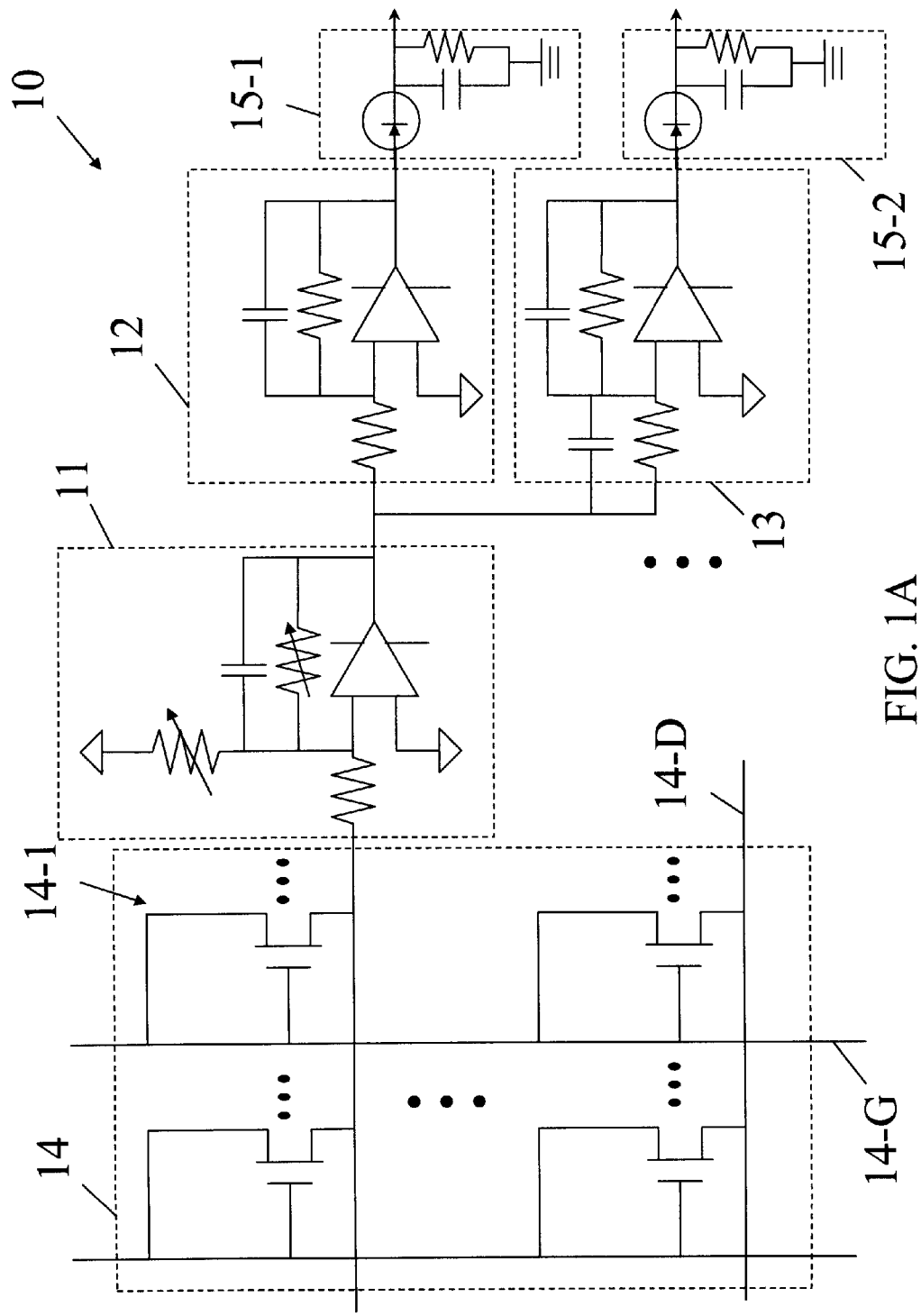
FIG. 1A is a schematic circuit diagram of a photo detector array consistent with an example of the present invention.

FIG. 1A is a schematic circuit diagram of a photo detector array 10 consistent with an example of the present invention. Referring to FIG. 1A, the photo detector array 10 may include a photosensitive transistor array 14, and a first amplifier module 11, a second amplifier module 12 and a third amplifier module 13. The photosensitive transistor array 14 may include a plurality of photosensitive transistors 14-1 formed in rows and columns. A representative photosensitive transistor 14-1 is disposed near an intersection of one of a plurality of gate lines 14-G and one of a plurality of data lines 14-D orthogonal to the gate lines 14-G. Each of the plurality of data lines 14-D is electrically connected to the first amplifier module 11, which in turn is electrically connected to the second amplifier module 12 and the third amplifier module 13 connected in parallel with the second amplifier module 12. The photo detector array 10 may further include a first detector 15-1 and a second detector 15-2, which are electrically connected to the second amplifier module 12 and the third amplifier module 13, respectively.

Figure 1B:
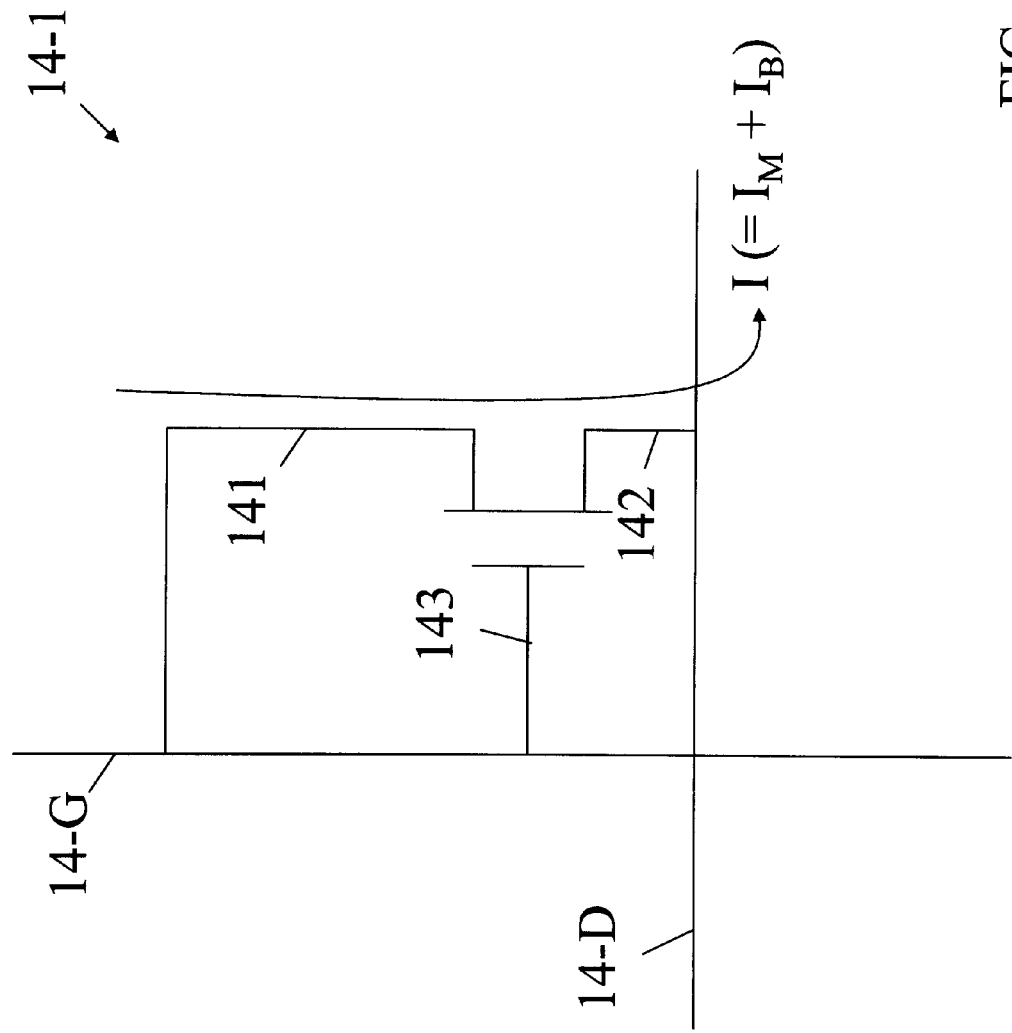
FIG. 1B is an enlarged circuit diagram of a photosensitive transistor of the photo detector array illustrated in FIG. 1A.

FIG. 1B is an enlarged circuit diagram of the photosensitive transistor 14-1 of the photo detector array 10 illustrated in FIG. 1A. The photosensitive transistor 14-1 may function to detect light and serve as a switch. Referring to FIG. 1B, the photosensitive transistor 14-1 may include a first electrode 141, a second electrode 142 and a gate electrode 143. The first electrode 141, which serves as a drain of the photosensitive transistor 14-1, is connected to the gate line 14-G. The second electrode 142, which serves as a source of the photosensitive transistor 14-1, is connected to the data line 14-D. The gate electrode 143 is connected to the gate line 14-G and thus is short-circuited to the first electrode 141, which may advantageously prevent parasitic capacitance from accumulation therebetween. In the absence of an input optical signal provided from, for example, a light source such as a stylus or torch, a pressure source such as a force applied from an ordinary pen or fingertip, or even the shadow of an object, only the background light may be detected by the photosensitive transistor 14-1 if the gate line 14-G is selected. The background light is converted to a photo current $I_B$, which is generally a relatively small current. In the presence of an input optical signal, the photosensitive transistor 14-1 generates a current I if the gate line 14-G is selected. The current I includes an image current $I_M$ due to the input optical signal and the photo current $I_B$ due to the background light. The current I is provided to the first amplifier module 11.

Figure 1C:
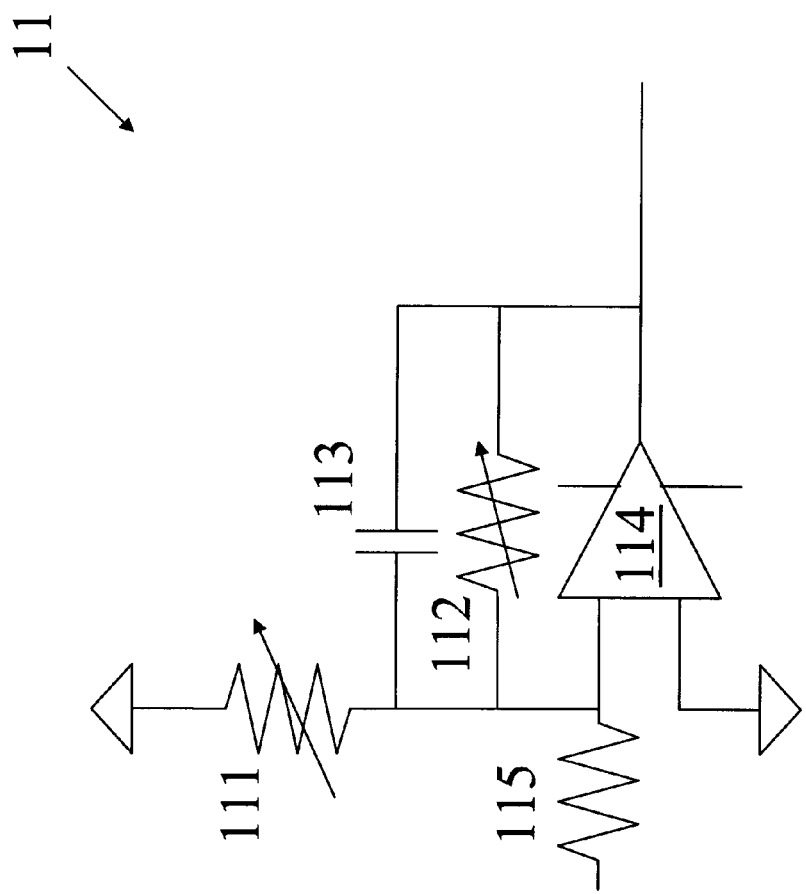
FIG. 1C is an enlarged circuit diagram of a first amplifier module of the photo detector array illustrated in FIG. 1A.

FIG. 1C is an enlarged circuit diagram of the first amplifier module 11 of the photo detector array 10 illustrated in FIG. 1A. Referring to FIG. 1C, the first amplifier module 11 may include a first variable resistor 111, a second variable resistor 112, a capacitor 113, an operational amplifier 114 and a resistor 115. The first amplifier module 11 may function to obtain the image current $I_M$ out of the current I by removing the photo current $I_B$. The resistance of the first variable resistor 111 may vary as the photo current $I_B$ varies. Specifically, the resistance of the first variable resistor 111 may be automatically adjusted in response to the variation in the background light intensity so as to provide differential signal compensation. Therefore, the photo current $I_B$ may be cancelled in the operational amplifier 114 due to a differential amplifier circuit function. As a result, interference caused by the background light may be minimized, which may enhance the system sensitivity and expand the dynamic range of the photo detector array 10.

In the absence of an input optical signal, the first variable resistor 111 may maintain an output voltage of the first amplifier module 11 at a stable level. That is, the gain of the first amplifier module 11 may be designed with a substantially large value (but not infinite) such that the signal response is sensitive enough to determine whether an input optical signal is light or shadow. In one example consistent with the present invention, when an output value is smaller than the level, it is determined that an input optical signal is provided by a light stylus or a light pen. Furthermore, when an output value is greater than the level, it is determined that an input optical signal is provided by a shadow. In another example, when an output value is greater than the level, it is determined that an input optical signal is provided by a light stylus. Furthermore, when an output value is smaller than the level, it is determined that an input optical signal is provided by a shadow. In still another example, the stable level may include a gray scale value "128", given 8 bits per pixel. A relatively white-color optical input signal has a gray scale value ranging from 128 to 255, while a relatively black-color optical input signal has a gray scale value ranging from 0 to 128. The compensation process may thus compensate for the variation in the background light and the differences of optoelectronic characteristics of the plurality of photosensitive transistors 14-1 as well. Consequently, the output voltage of each of the plurality of photosensitive transistors 14-1 of the photo detector array 10 may be maintained at a stable level in the absence of an input optical signal. Therefore, a light stylus may be used as an entry tool. Similarly, the shadow of finger, chopstick or ordinary pen may also serve as an entry tool. In one example, an input optical signal having a diameter of approximately 3 millimeter or greater may be detectable by the photo detector array 10.

Figure 1D:
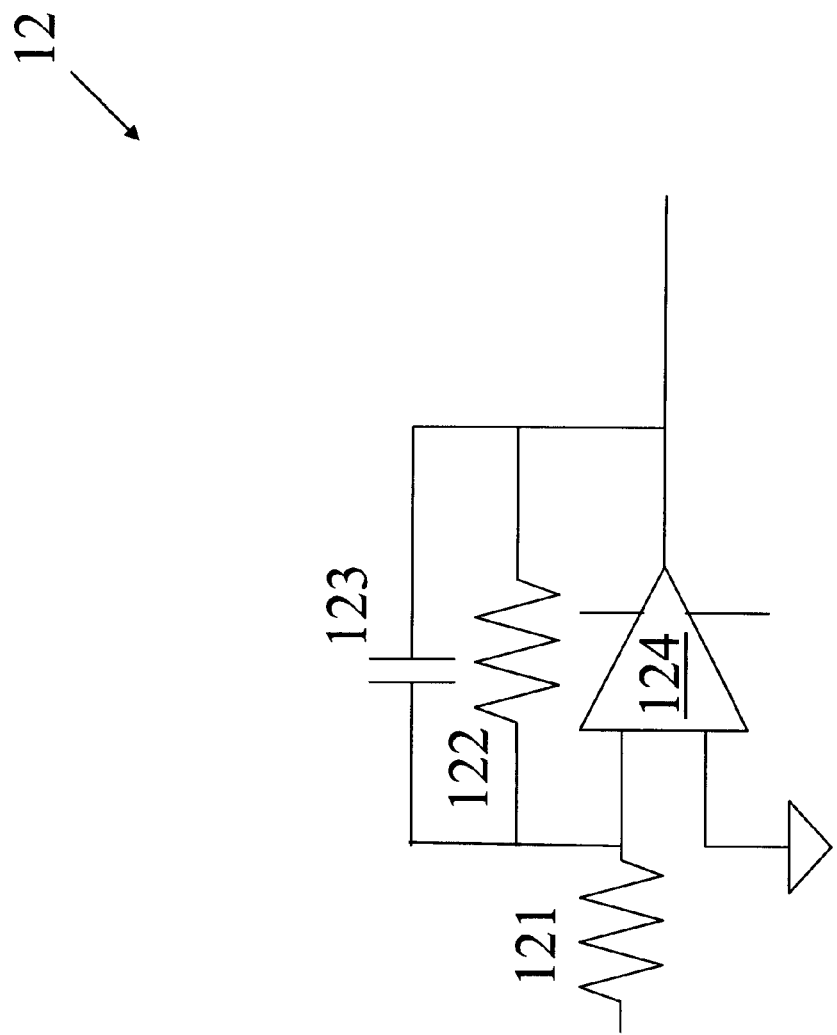
FIG. 1D is an enlarged circuit diagram of a second amplifier module of the photo detector array illustrated in FIG. 1A.

FIG. 1D is an enlarged circuit diagram of the second amplifier module 12 of the photo detector array 10 illustrated in FIG. 1A. Referring to FIG. 1D, the second amplifier module 12 may include a first resistor 121, a second resistor 122, a capacitor 123 and an operational amplifier 124. The second resistor 122 and the capacitor 123 form a low pass filter. The second amplifier module 12 may function to process a direct-current (dc) component of a signal provided by the first amplifier module 11. Specifically, the second amplifier module 12 filters out or attenuates frequencies higher than the cutoff frequency of the low pass filter, thereby reducing the high-frequency noise in the dc component. The dc component is generated by an optical input through, for example, a general stylus, pen, torch, finger or chopstick. In one example consistent with the present invention, the photo detector array 10 may include an analog-to-digital converter electrically connected to the second amplifier module 12 at a subsequent stage to further process the dc component.

Figure 1E:
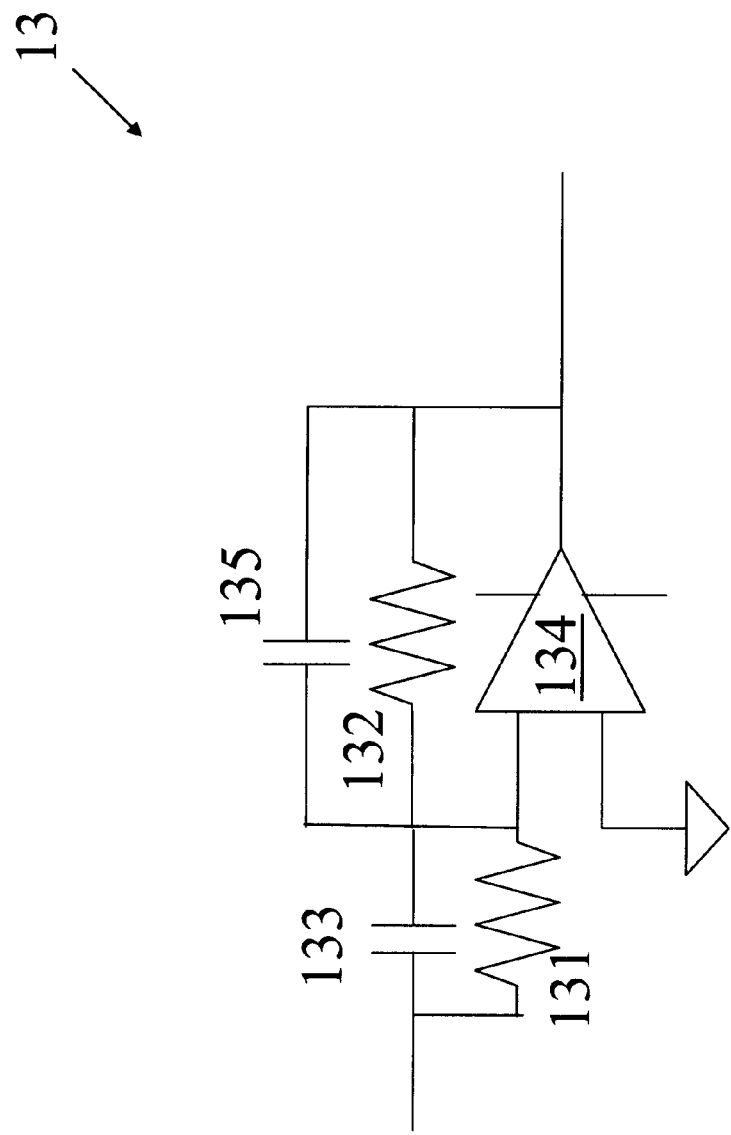
FIG. 1E is an enlarged circuit diagram of a third amplifier module of the photo detector array illustrated in FIG. 1A.

FIG. 1E is an enlarged circuit diagram of the third amplifier module 13 of the photo detector array 10 illustrated in FIG. 1A. Referring to FIG. 1E, the third amplifier module 13 may include a first resistor 131, a second resistor 132, a first capacitor 133, a second capacitor 135 and an operational amplifier 134. The third amplifier module 13 may serve as a band pass filter, and process an alternating-current (ac) component of a signal provided by the first amplifier module 11. The ac component is generated by an optical input through, for example, a dedicated light stylus or light pen having a specific output specification such as frequency. The third amplifier module 13 is able to detect a modulated optical signal from the dedicated light stylus, which converts a force applied therethrough on a panel into a frequency. In one example consistent with the present invention, the photo detector array 10 may include a phase-locked-loop ("PLL") circuit (not shown) electrically connected to the third amplifier module 13 at a subsequent stage to convert the frequency of the dedicated light stylus into a voltage signal.

Referring back to FIG. 1A, each of the first detector 15-1 and the second detector 15-2 may include a diode (not numbered) and a low pass filter (not numbered) connected in parallel with the diode. The second detector 15-2 may be able to detect the amplitude of the signal from the third amplifier module 13.

Figure 2A:
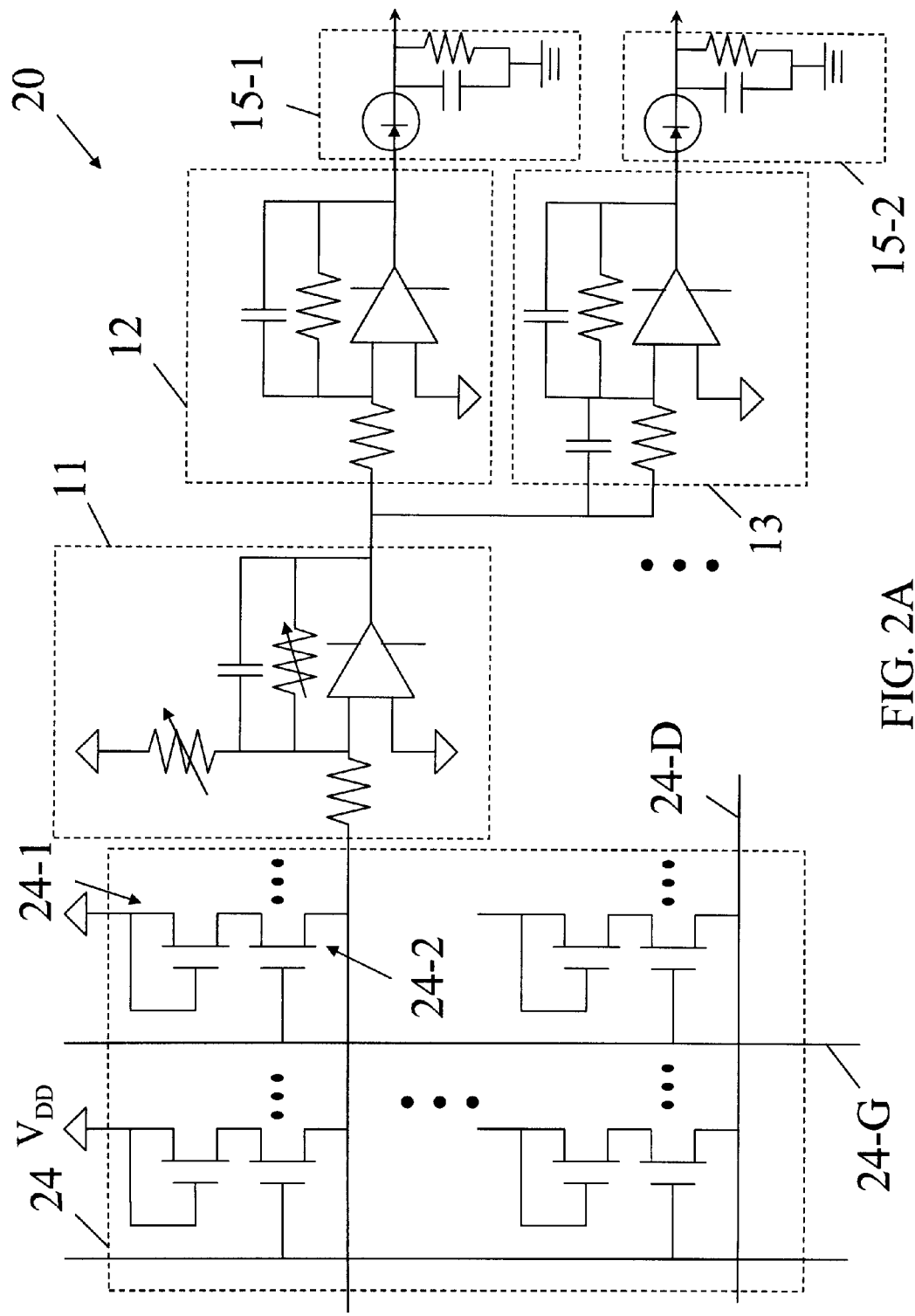
FIG. 2A is a schematic diagram of a photo detector array consistent with another example of the present invention.

FIG. 2A is a schematic diagram of a photo detector array 20 consistent with another example of the present invention. Referring to FIG. 2A, the photo detector array 20 may be similar to the photo detector array 10 illustrated in FIG. 1A except, for example, a photosensitive transistor array 24 replaces the photosensitive transistor array 14. The photosensitive transistor array 24 may include a plurality of photosensitive transistors 24-1 and a plurality of switching transistors 24-2 formed in rows and columns. A representative photosensitive transistor 24-1 and a representative switching transistor 24-2 are disposed near an intersection of one of a plurality of gate lines 24-G and one of a plurality of data lines 24-D orthogonal to the gate lines 24-G.

Figure 2B:
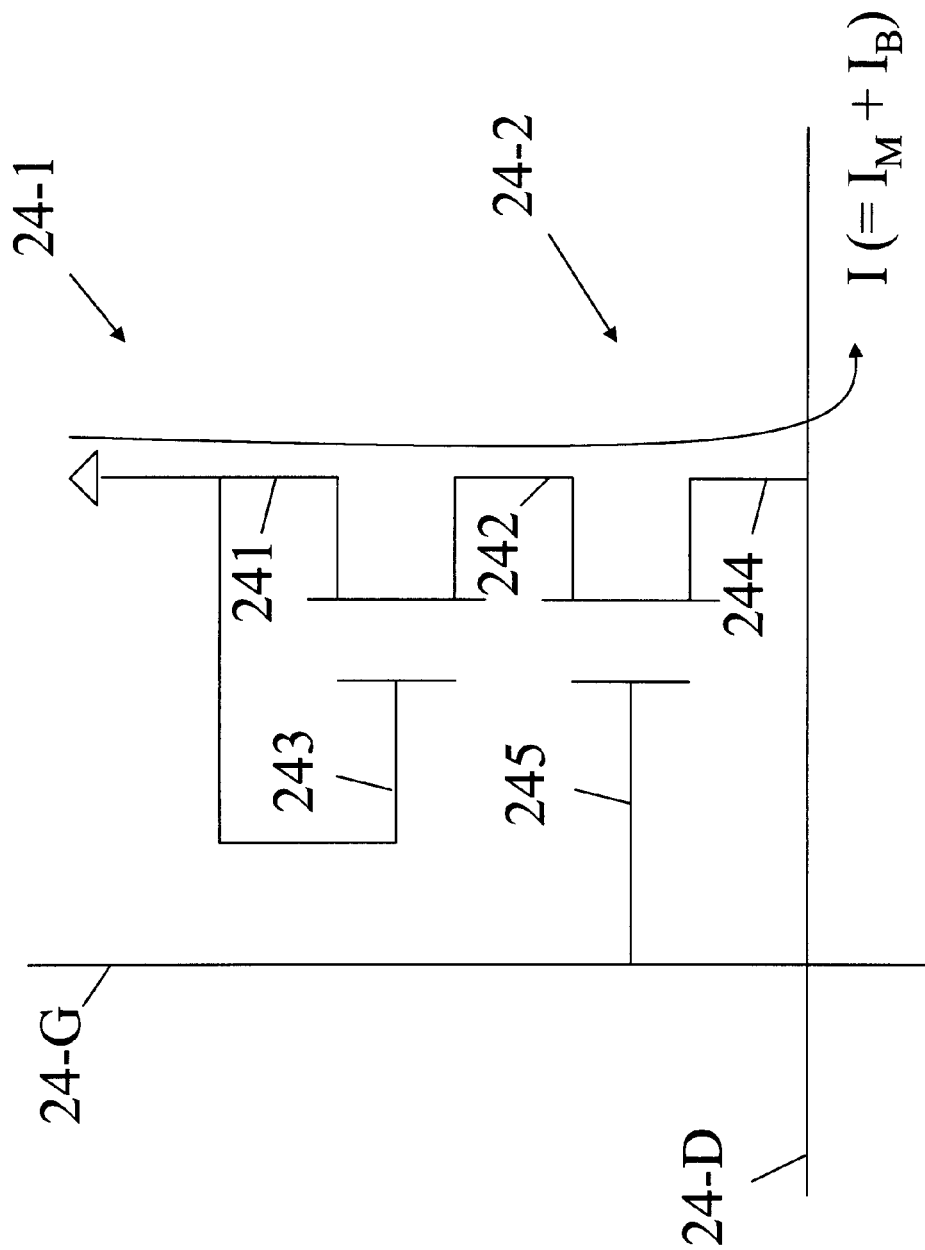
FIG. 2B is an enlarged circuit diagram of a photosensitive transistor and a switching transistor of the photo detector array illustrated in FIG. 2A.

FIG. 2B is an enlarged circuit diagram of the photosensitive transistor 24-1 and the switching transistor 24-2 of the photo detector array 20 illustrated in FIG. 2B. Referring to FIG. 2B, the photosensitive transistor 24-1 may include a first electrode 241, a second electrode 242 and a gate electrode 243, which serve as a drain, source and gate of the photosensitive transistor 24-1, respectively. The first electrode 241 and the gate electrode 243 are short-circuited to prevent parasitic capacitance from accumulation therebetween. The switching transistor 24-2 may include a first electrode 242, a second electrode 244 and a gate electrode 245, which serve as a drain, source and gate of the switching transistor 24-2, respectively. The gate electrode 245 is connected to the gate line 24-G, and the second electrode 244 is connected to the data line 24-D.

In the absence of an input optical signal provided from, for example, a stylus, an ordinary pen, a torch, a fingertip or even the shadow of an object, only the background light may be detected by the photosensitive transistor 24-1 if the gate line 24-G is selected, which turns on the switching transistor 24-2 and the photosensitive transistor 24-1. The background light may be converted to a photo current $I_B$. In the presence of an input optical signal, the photosensitive transistor 24-1 generates a current I if the gate line 24-G is selected. The current I includes an image current $I_M$ due to the input optical signal and the photo current $I_B$ due to the background light. The current I is provided to the first amplifier module 11.

Figure 2C:
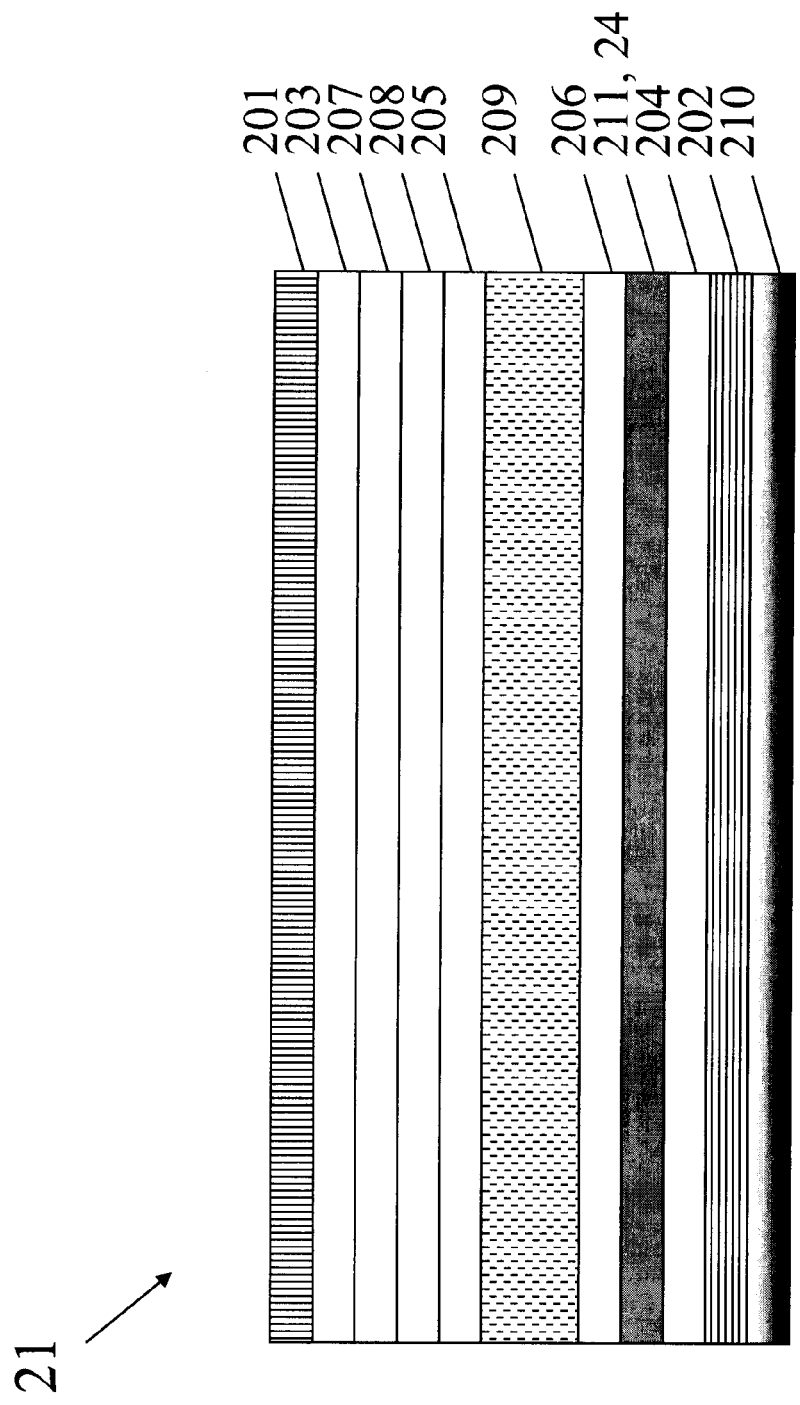
FIG. 2C is a schematic cross-sectional diagram of a photo detector array incorporated in a thin film transistor liquid crystal display panel consistent with an example of the present invention.

FIG. 2C is a schematic cross-sectional diagram of the photo detector array 24 incorporated in a thin film transistor liquid crystal display panel 21 consistent with an example of the present invention. Referring to FIG. 2C, the panel 21 may include a pair of polarizers 201, 202, a pair of glass substrates 203, 204, a pair of alignment films 205, 206, a color filter film 207, a common electrode 208, a liquid crystal cell 209, a backlight unit 210 and a thin film transistor ("TFT") layer 211. The photo detector array 24 may be formed in the TFT layer 211. In one example consistent with the present invention, the gate lines 24-G illustrated in FIG. 2B serve as a portion of gate lines for switching transistors in the TFT layer 211.

Figure 3A:
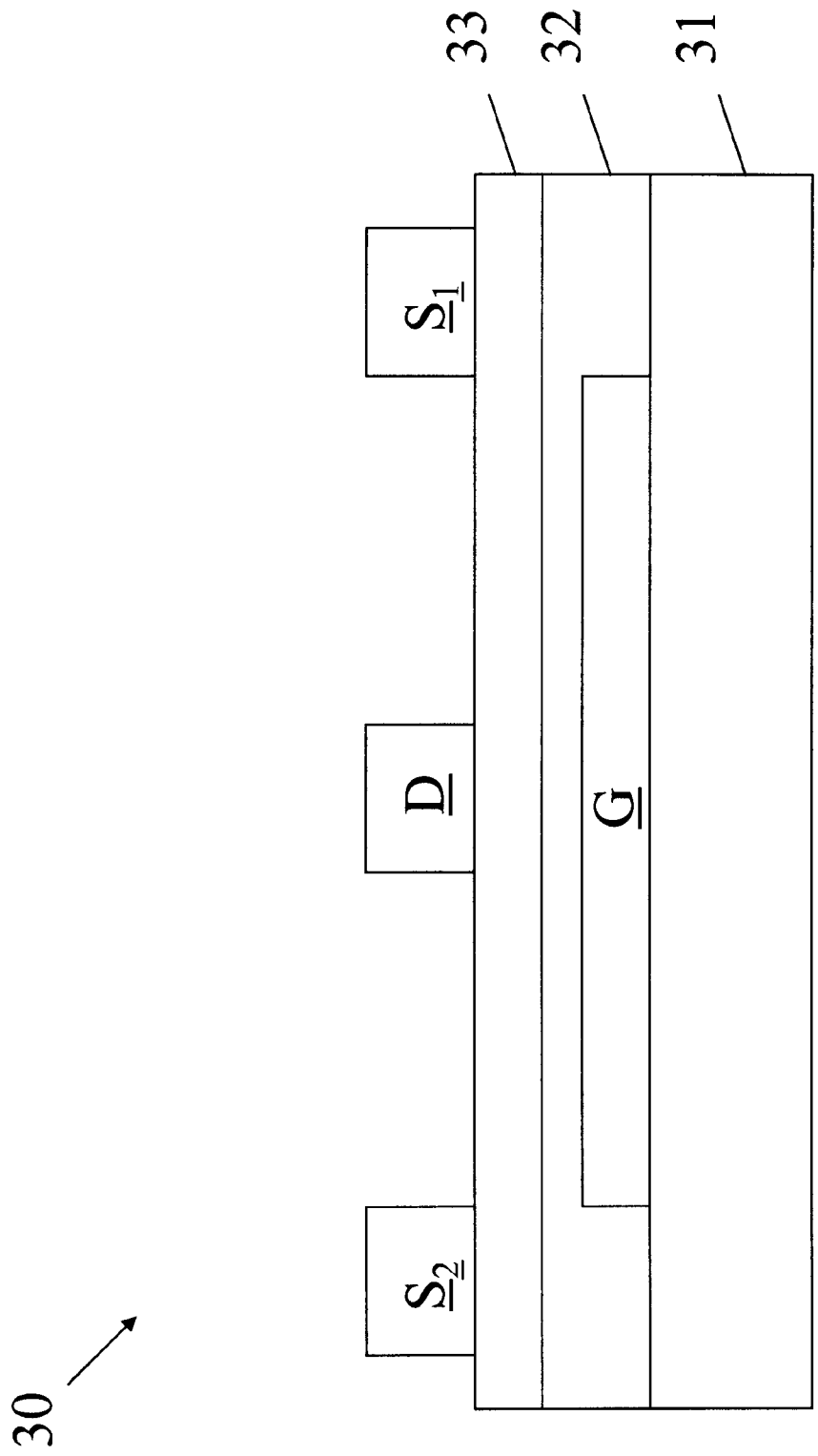
FIGS. 3A and 3B are respectively a cross-sectional view and a top view of a photo detector device consistent with examples of the present invention.
Figures 3B, 3C:
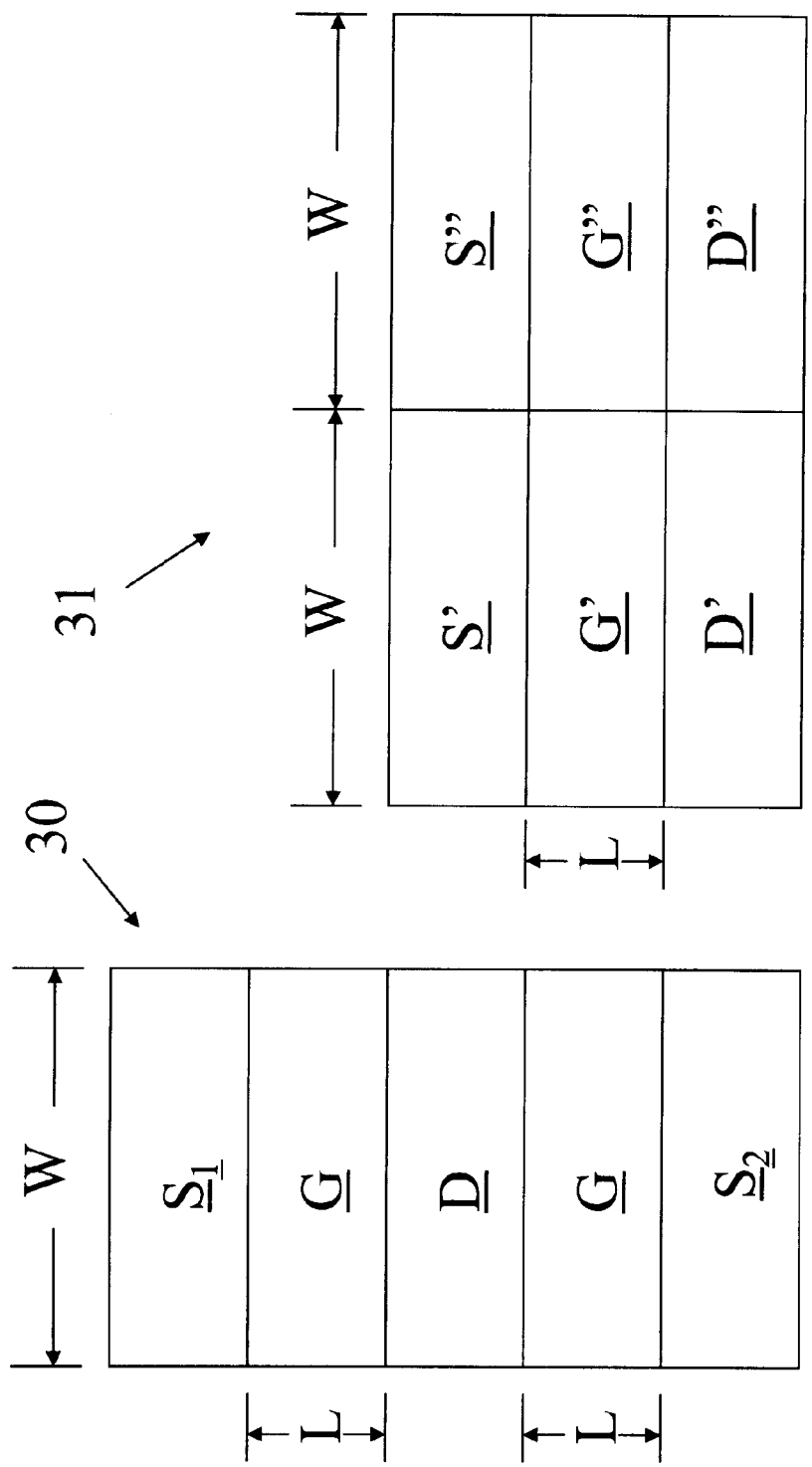
FIG. 3C is a top view of a conventional photo detector device.

FIGS. 3A and 3B are respectively a cross-sectional view and a top view of a photo detector device 30 consistent with examples of the present invention. Referring to FIG. 3A, the photo detector device 30 may include a substrate 31, a gate electrode "G" over the substrate 31, an insulating layer 32 over the gate electrode G, a semiconductor layer 33 over the insulating layer 32, and a first source electrode "$S_1$", a drain electrode "D" and a second source electrode "$S_2$" over the semiconductor layer 33. To avoid accumulation of parasitic capacitance, the drain electrode D and the gate electrode G may be coupled to one another as illustrated in FIG. 1A. In the present example, the gate electrode G is aligned with the first source electrode $S_1$ and the second source electrode $S_2$. In other examples, the gate electrode G may cross over a portion of the first source electrode $S_1$ or the entire first source electrode $S_1$. Similarly, the gate electrode G may cross over a portion of the second source electrode $S_2$ or the entire second source electrode $S_2$. Referring to FIG. 3B, the photo detector device 30 may include two channel widths "W" and therefore two folds of channel width-to-length ratio, i.e., 2 (W/L), L being the channel length, in five unit areas, each of which is substantially equal to a source or drain electrode area.

FIG. 3C is a top view of a conventional photo detector device 31. To achieve the same two folds of channel width-to-length ratio, a total number of six unit areas are required in the conventional photo detector device 31, including a first channel width defined by a first set of source, drain and gate electrodes S', D' and G', respectively, and a second channel width defined by a second set of source, drain and gate electrodes S", D" and G", respectively. By comparison, the photo detector device 30 illustrated in FIG. 3A or 3B is more area effective than the conventional photo detector device 31.

Figure 4A:
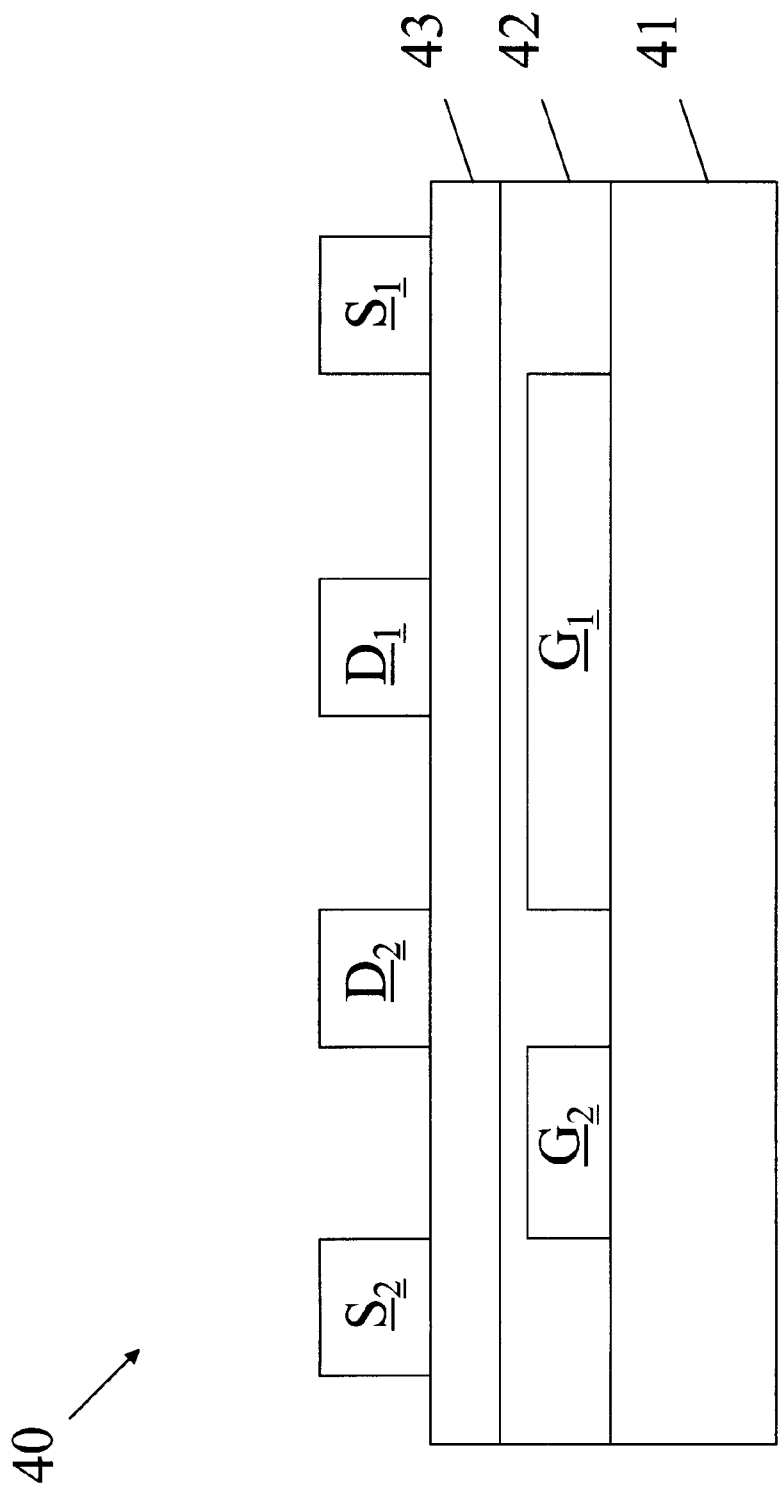
FIGS. 4A and 4B are respectively a cross-sectional view and a top view of a photo detector device consistent with examples of the present invention.
Figures 4B, 4C:
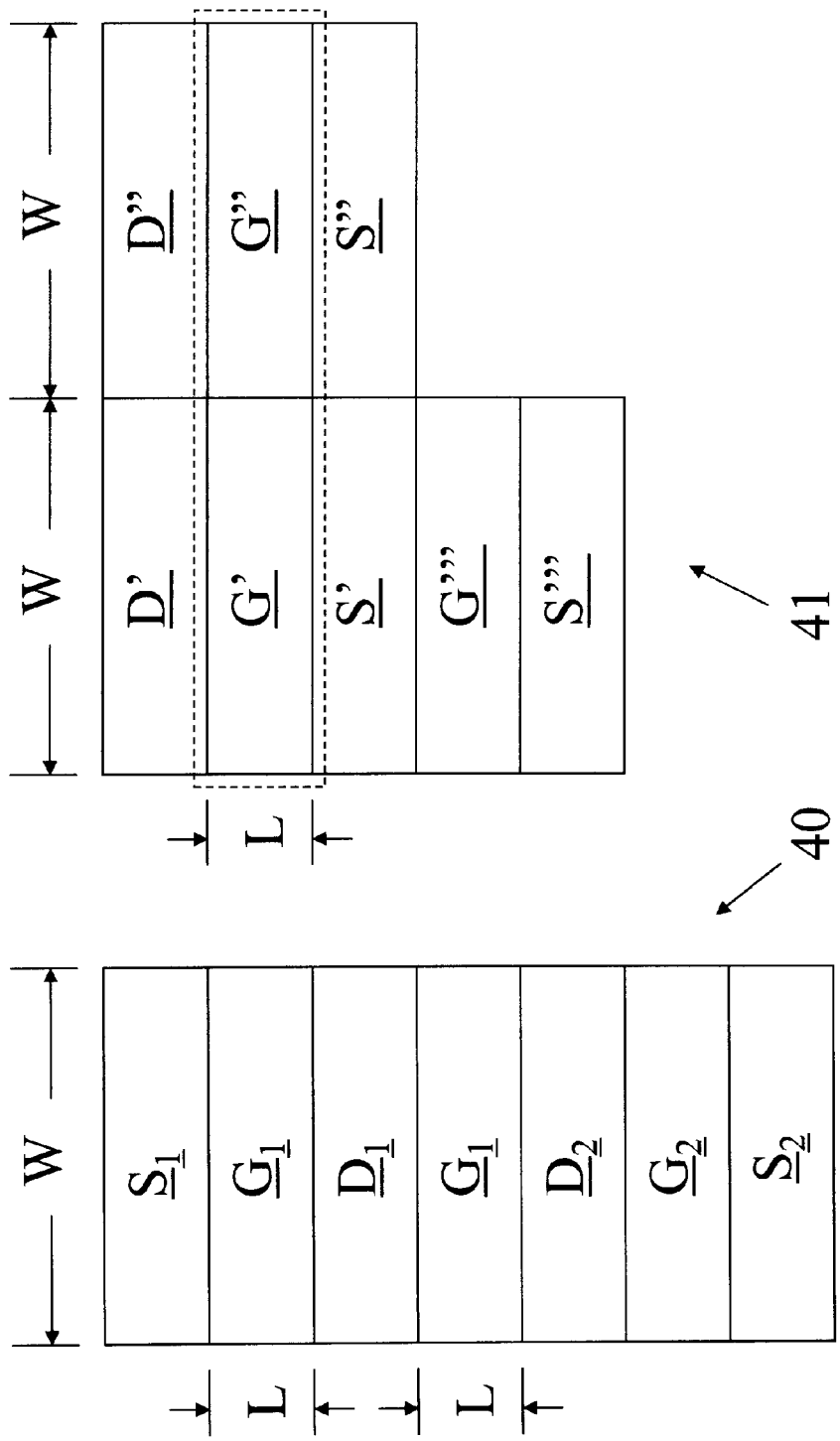
FIG. 4C is a top view of another conventional photo detector device.

FIGS. 4A and 4B are respectively a cross-sectional view and a top view of a photo detector device 40 consistent with examples of the present invention. Referring to FIG. 4A, the photo detector device 40 may include a substrate 41, a first gate electrode "$G_1$" and a second gate electrode "$G_2$" over the substrate 41, an insulating layer 42 over the gate electrodes $G_1$ and $G_2$, a semiconductor layer 43 over the insulating layer 42, and a first source electrode "$S_1$", a first drain electrode $D_1$, a second drain electrode $D_2$ and a second source electrode $S_2$ over the semiconductor layer 43. The first gate electrode $G_1$ and the second gate electrodes $G_2$ are the gates of a photosensitive transistor and a switching transistor, respectively. To avoid accumulation of parasitic capacitance, the first drain electrode $D_1$ and the first gate electrode $G_1$ may be coupled to one another as illustrated in FIG. 2A. The first gate electrode $G_1$ may overlap the first source electrode $S_1$ or the second drain electrode $D_2$ or both. The second gate electrode $G_2$ is aligned with the second source electrode $S_2$ and the second drain electrode $D_2$. In other examples, however, the second gate electrode $G_2$ may cross over a portion of the second source electrode $S_2$ or the entire second source electrode $S_2$. Similarly, the second gate electrode $G_2$ may cross over a portion of the second drain electrode $D_2$ or the entire second drain electrode $D_2$. Referring to FIG. 4B, the photo detector device 40 includes two channel widths "W" and therefore two folds of channel width-to-length ratio, i.e., 2 (W/L), in seven unit areas.

FIG. 4C is a top view of another conventional photo detector device 41. To achieve the same two folds of channel width-to-length ratio, a total number of eight unit areas are required in the conventional photo detector device 41, including a first channel width defined by a first set of source, drain and gate electrodes S', D' and G', respectively, and a second channel width defined by a second set of source, drain and gate electrodes S", D" and G", respectively. A third transistor including S', G''' and S''' serves as a switching transistor. By comparison, the photo detector device 40 illustrated in FIG. 4A or 4B is more area effective than the conventional photo detector device 41.

Figure 5:
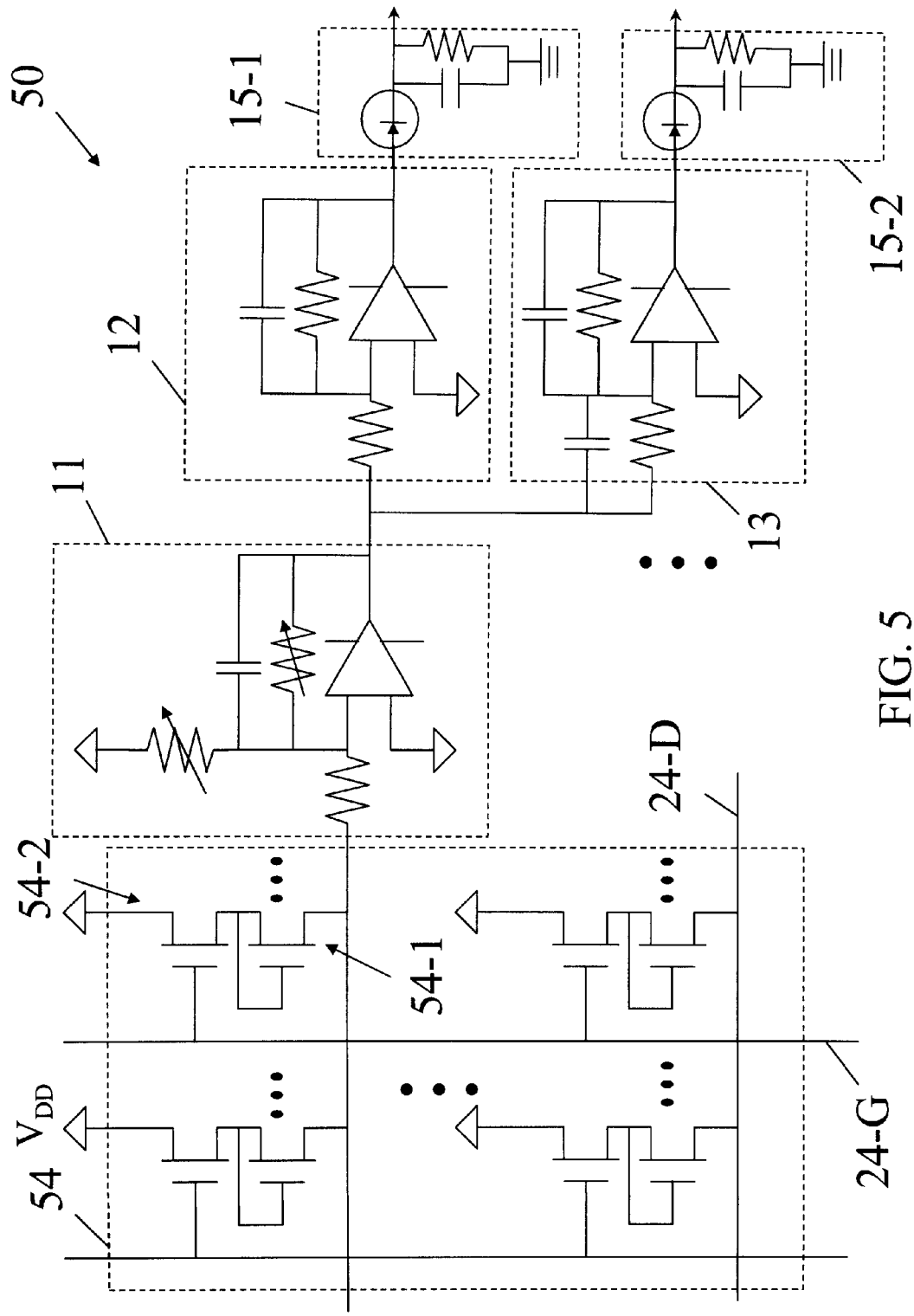
FIG. 5 is a schematic diagram of a photo detector array consistent with still another example of the present invention.

FIG. 5 is a schematic diagram of a photo detector array 50 consistent with still another example of the present invention. Referring to FIG. 5, the photo detector array 50 may be similar to the photo detector array 20 illustrated in FIG. 2A except, for example, a photosensitive transistor array 54 replaces photosensitive transistor array 24. The photosensitive transistor array 54 may include a plurality of photosensitive transistors 54-1 and a plurality of switching transistors 54-2 formed in rows and columns. A representative photosensitive transistor 54-1 and a representative switching transistor 54-2 are disposed near an intersection of one of a plurality of gate lines 24-G and one of a plurality of data lines 24-D orthogonal to the gate lines 24-G. The switching transistor 54-2 may include a gate (not numbered) coupled to one gate line 24-G, a drain (not numbered) coupled to the $V_{DD}$, and a source (not numbered). Skilled persons in the art will understand that the drain and source of a transistor may be exchangeable, depending on the voltage levels to which they are connected. The photosensitive transistor 54-1 may include a drain (not numbered) coupled to the source of the switching transistor 54-2, a source (not numbered) coupled to one data line 24-D, and a gate (not numbered) coupled to its drain.

Figure 6A:
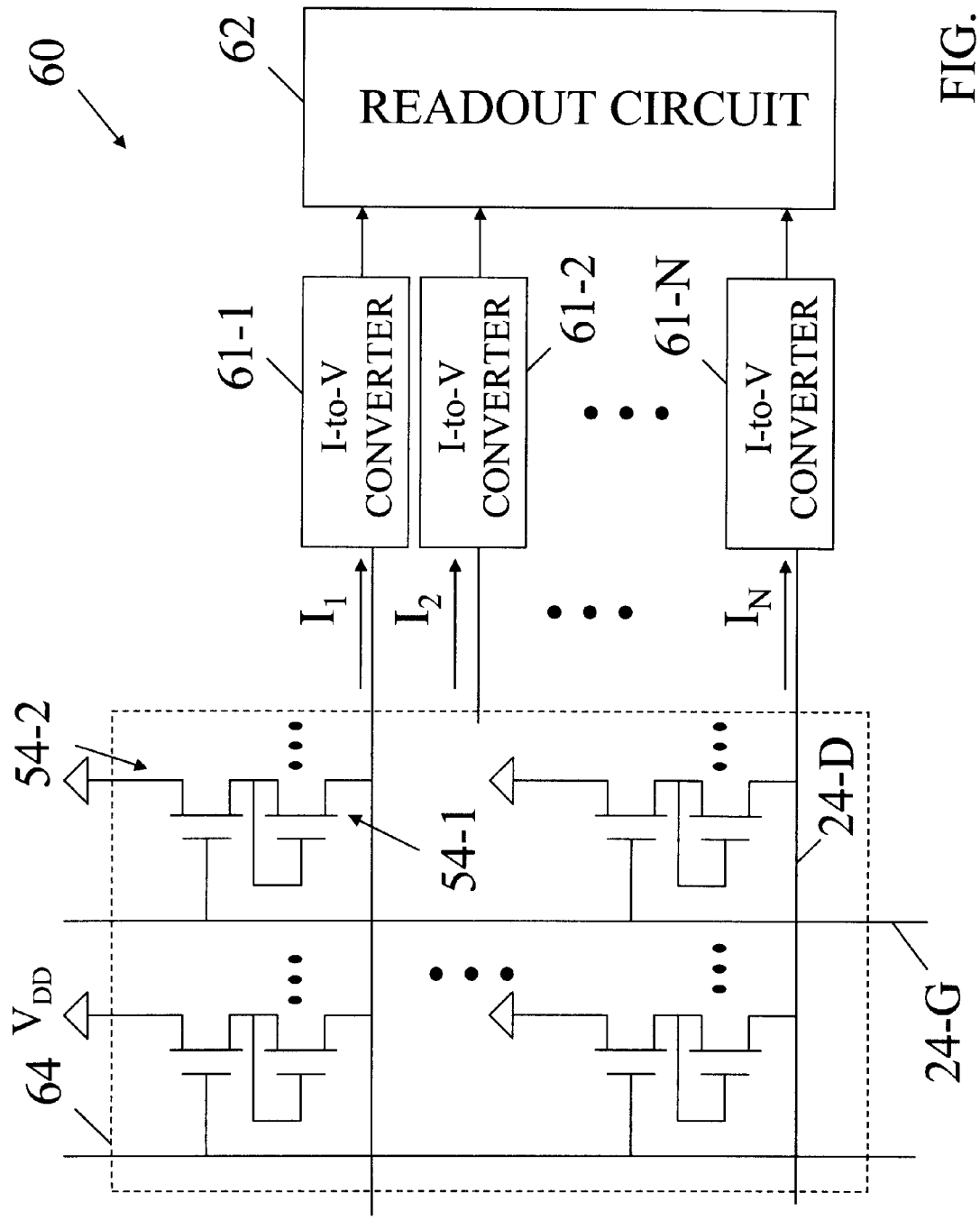
FIG. 6A is a schematic diagram of a photo detector array consistent with yet another example of the present invention.

FIG. 6A is a schematic diagram of a photo detector array 60 consistent with yet another example of the present invention. Referring to FIG. 6A, the photo detector array 60 may include a photosensitive transistor array 64, a plurality of current-to-voltage converters 61-1 to 61-N, N being a natural number, and a readout circuit 62. The photosensitive transistor array 64 may include one of the photosensitive transistor arrays 14, 24 and 54 illustrated in FIGS. 1A, 2A and 5, respectively. As shown here, photosensitive transistor array 64 comprises the photosensitive transistor array 54 of FIG. 5. Each of the current-to-voltage converters 61-1 to 61-N may include a circuit capable of performing current to voltage transformation for a corresponding one of photo currents $I_1$ to $I_N$. The circuit may include a resistor-capacitor network, and may further include a rectifier. The readout circuit 62 may be configured to calculate the coordinates of an optical source that causes a photo current. The circuit structure and functions of the converters 61-1 to 61-N and the readout circuit 62 will be discussed below.

Figure 6B:
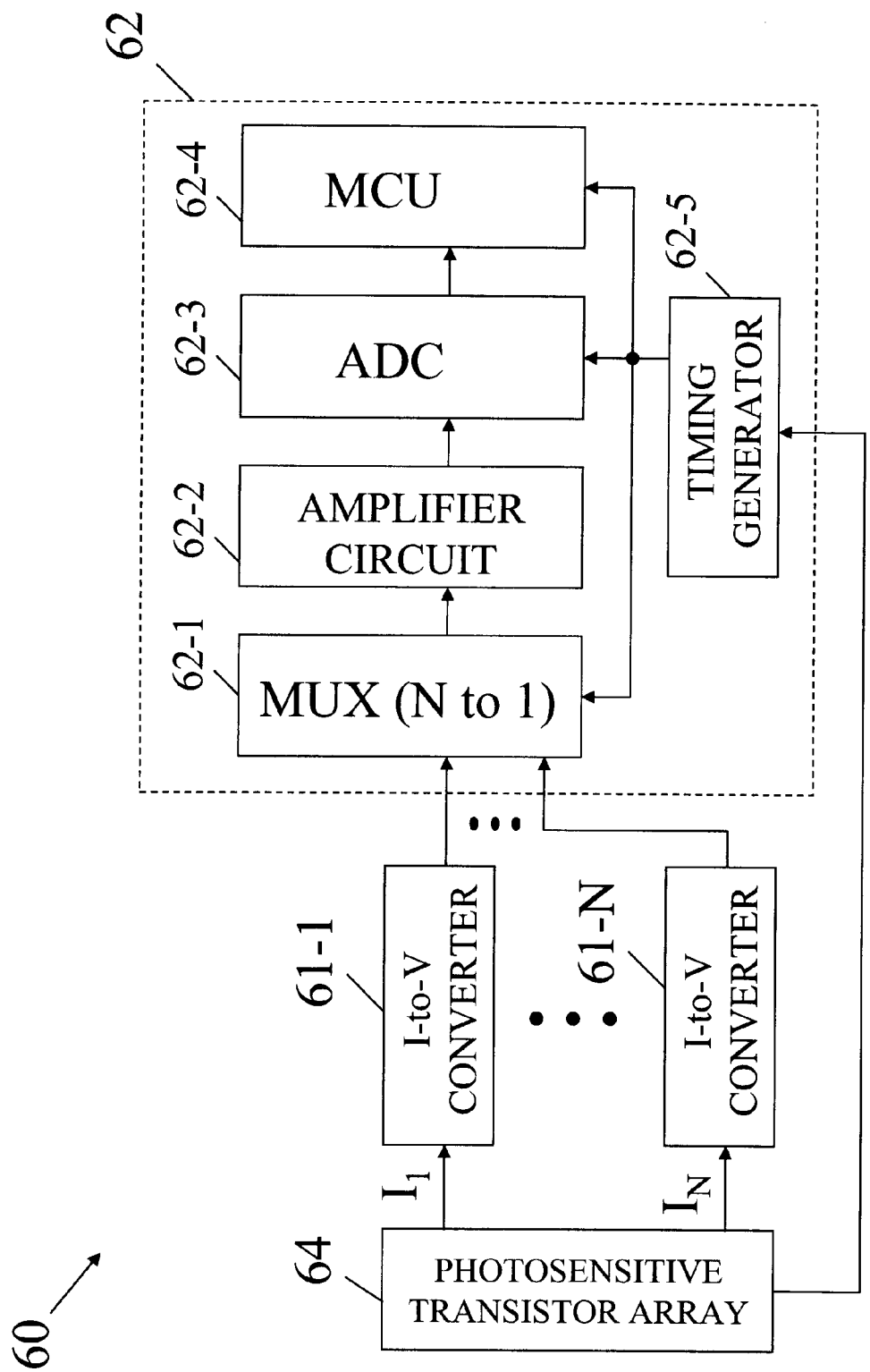
FIG. 6B is a block diagram of an exemplary readout circuit of the photo detector array illustrated in FIG. 6A.

FIG. 6B is a block diagram of an exemplary readout circuit of the photo detector array 60 illustrated in FIG. 6A. Referring to FIG. 6B, the readout circuit 62 may include an N-to-1 multiplexer 62-1, an amplifier circuit 62-2, an analog-to-digital converter (ADC) 62-3, a micro computer unit (MCU) 62-4 and a timing generator 62-5. The multiplexer 62-1 may provide a voltage signal from the converters 61-1 to 61-N to the amplifier circuit 62-2 in a sequential order. The voltage signal may be amplified in the amplifier circuit 62-2 and then sampled in the ADC 62-3. The MCU 62-4 may determine the coordinates of an optical source that causes a photo current based on a digital output from the ADC 62-3. The timing generator 62-5 is able to synchronize the operations of the multiplexer 62-1, ADC 62-3 and MCU 62-4 based on synchronous signals used in the photosensitive transistor array 64 for gate synchronization. The readout circuit 62 in one example may be formed in integrated circuits, which may facilitate the fabrication of the photo detector array 60. The photosensitive transistor array 64 and the current-to-voltage converters 61-1 may be formed on the same panel of an LCD with the thin film transistors of the LCD at the sacrifice of approximately 10% of aperture ratio.

Figure 6C:
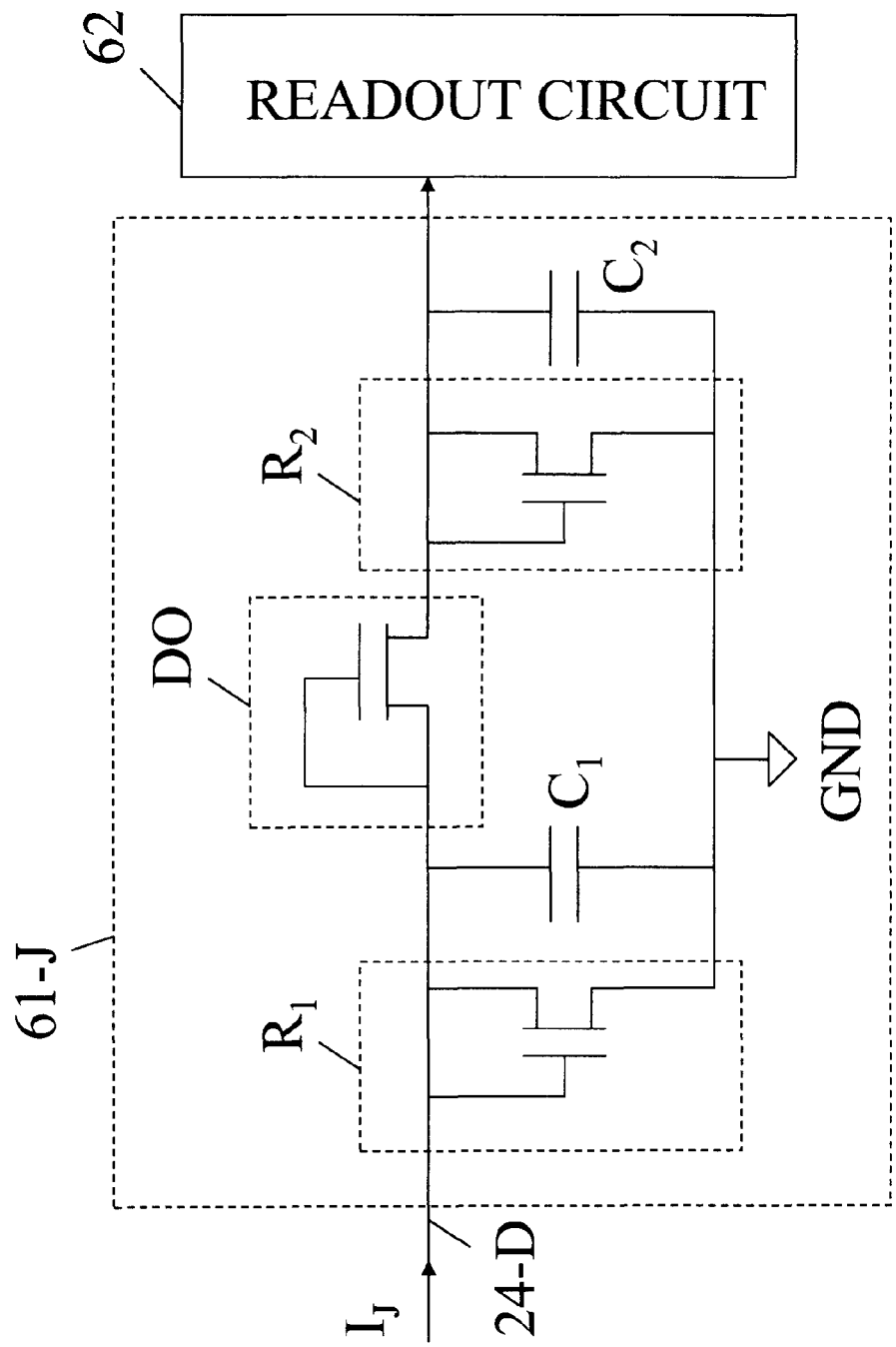
FIGS. 6C to 6F are block diagrams of exemplary current-to-voltage converters of the photo detector array illustrated in FIG. 6A.

FIGS. 6C to 6F are block diagrams of exemplary current-to-voltage converters of the photo detector array 60 illustrated in FIG. 6A. Referring to FIG. 6C, in one example, a current-to-voltage converter 61-J, J being one of 1 to N, may include a first resistor labeled $R_1$, a second resistor $R_2$, a first capacitor $C_1$, a second capacitor $C_2$ and a diode DO. The first resistor $R_1$ may include a gate and a drain, both of which are coupled to one data line 24-D, and a source coupled to a reference voltage rail such as a ground rail GND. The first capacitor $C_1$ is coupled between the one data line 24-D and the ground rail GND. The diode DO may include a gate and a drain, both of which are coupled to the one data line 24-D, and a source coupled to the readout circuit 62. The second resistor $R_2$ may include a gate and a drain, both of which are coupled to the source of the diode DO, and a source coupled to the ground rail GND. The second capacitor $C_2$ is coupled between the source of the diode DO and the ground rail GND.

The first and second resistors $R_1$ and $R_2$ may include a structure similar to that of a thin film transistor (TFT) of a liquid crystal display (LCD) device, and may be fabricated simultaneously with the TFTs of the LCD device in substantially the same process for fabricating the TFTs of the LCD. The first and second capacitors $C_1$ and $C_2$ may include a structure similar to that of a pixel capacitor of the TFT LCD, and may be fabricated simultaneously with the pixel capacitors of the TFT LCD. The diode DO, which may serve as a rectifier, includes a transistor structure similar to that of the TFT of the LCD device, and may be fabricated simultaneously with the TFTs of the LCD.

Figure 6D:
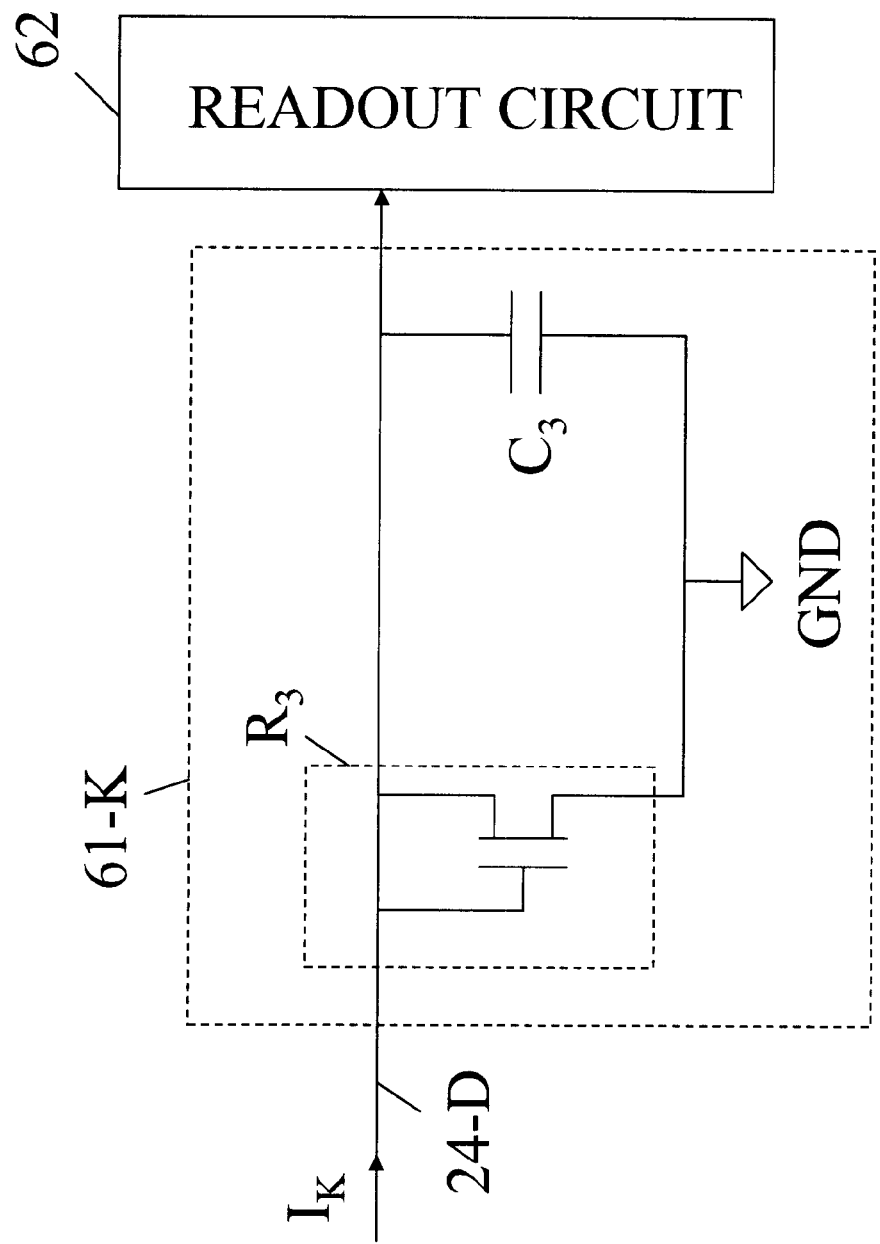

Referring to FIG. 6D, in another example, a current-to-voltage converter 61-K, K being one of 1 to N, may include a third resistor $R_3$ and a third capacitor $C_3$. The third resistors $R_3$ may include a gate and a drain, both of which are coupled to one data line 24-D and the readout circuit 62, and a source coupled to the ground rail GND. The third capacitor $C_3$ includes one terminal coupled to the one data line 24-D and the readout circuit 62, and the other terminal coupled to the ground rail GND.

Figure 6E:
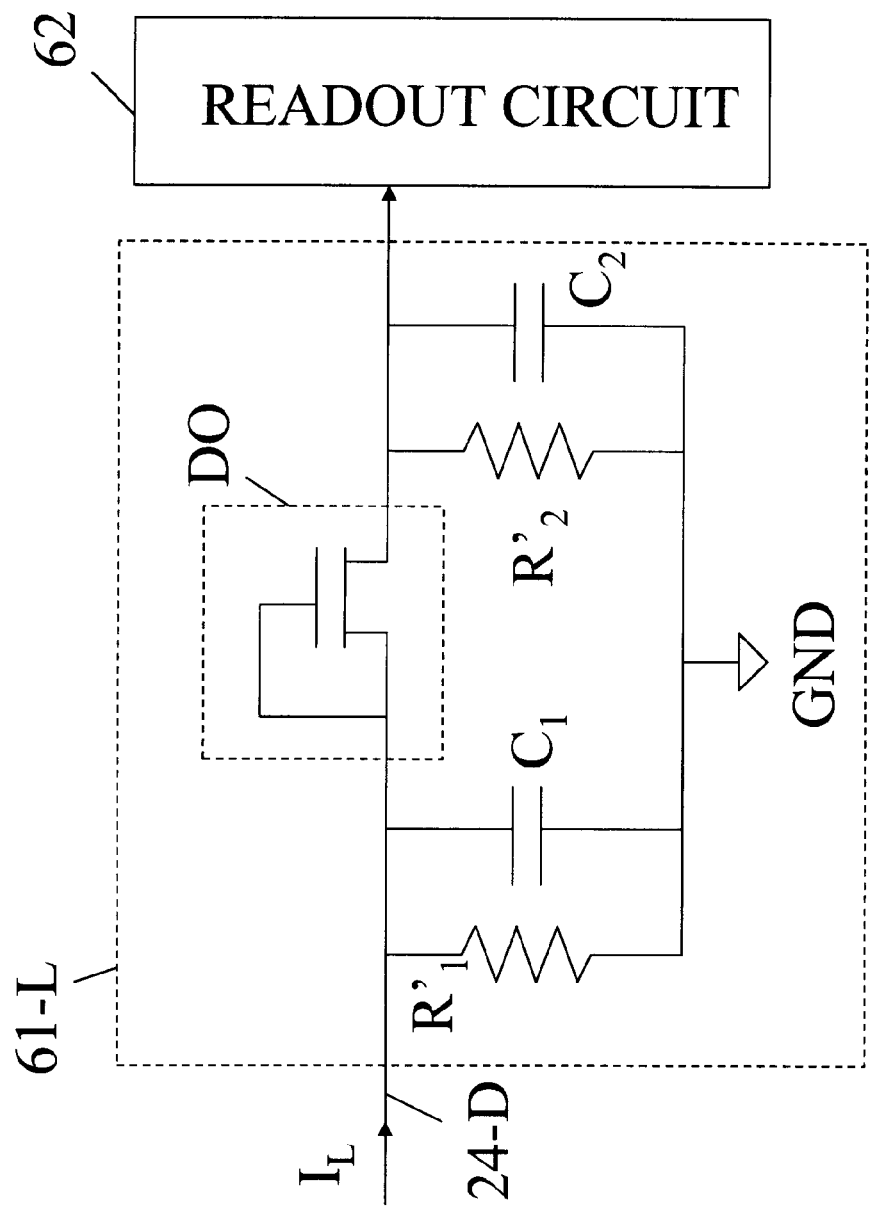

Referring to FIG. 6E, in still another example, a current-to-voltage converter 61-L, L being one of 1 to N, may be similar to the current-to-voltage converter 61-J illustrated in FIG. 6C except that, for example, resistors $R'_1$ and $R'_2$ replace resistors $R_1$, and $R_2$. Unlike the transistor structure of the resistors $R_1$ and $R_2$ illustrated in FIG. 6C, each of the resistors $R'_1$ and $R'_2$ may include a thin film of semiconductor material defined between electrodes. The resistors $R'_1$ and $R'_2$ may have a structure similar to that of a semiconductor channel in a TFT, and may be fabricated simultaneously with the TFTs of the LCD.

Figure 6F:
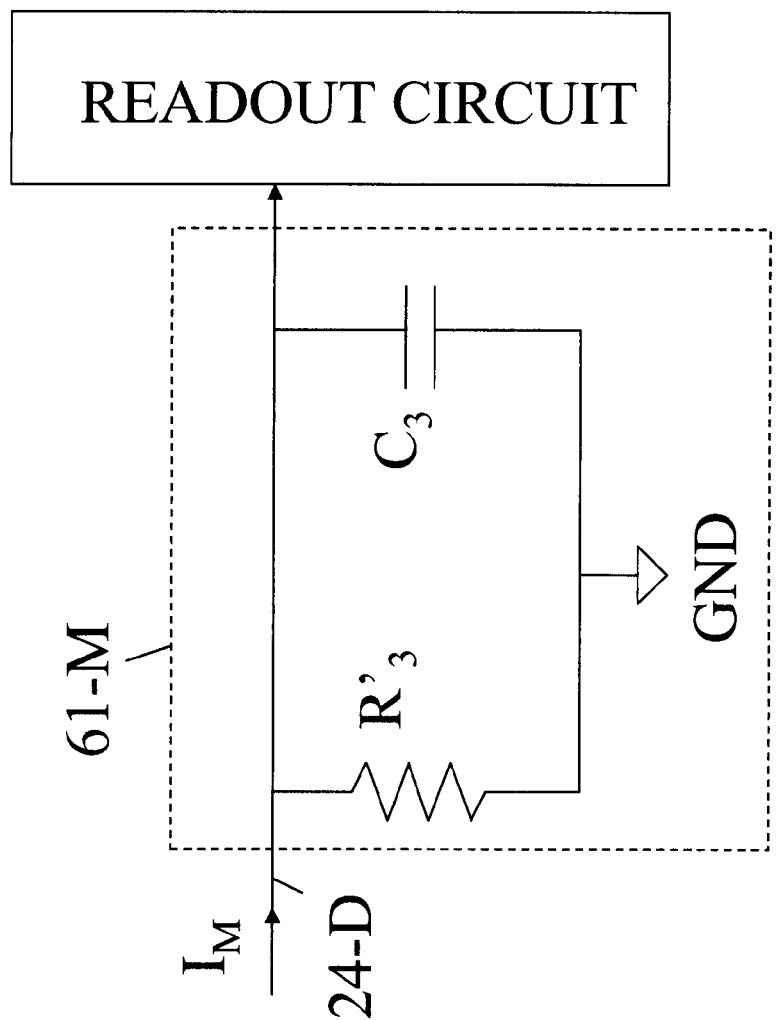

Referring to FIG. 6F, in yet another example, a current-to-voltage converter 61-M, M being one of 1 to N, may be similar to the current-to-voltage converter 61-K illustrated in FIG. 6D except that, for example, resistor $R'_3$ replaces resistor $R_3$. Unlike the transistor structure of the resistor $R_3$ illustrated in FIG. 6D, the resistor $R'_3$ may include a thin film of semiconductor material defined between electrodes. The resistor $R'_3$ may have a structure similar to that of a semiconductor channel in a TFT, and may be fabricated simultaneously with the TFTs of the LCD.

FIG. 7A is a cross-sectional view of portions of a photo detector array 70 consistent with an example of the present invention. Referring to FIG. 7A, the photo detector array 70 may include the photosensitive transistor 24-1 and switching transistor 24-2 illustrated in FIG. 2A, and the third resistor $R_3$ and third capacitor $C_3$ illustrated in FIG. 6D. The photosensitive transistor 24-1, switching transistor 24-2, third resistor $R_3$ and third capacitor $C_3$ may be formed on a same substrate 71 in substantially the same processes for fabricating a switching TFT array 79 (illustrated in FIG. 7B) of a display. The processes may include forming a patterned metal layer 72 over the substrate 71, which may eventually serve as gates for the transistors 24-1, 24-2 and 79, and a bottom electrode for the third capacitor $C_3$. Next, an insulating layer 73 such as a silicon nitride layer, a silicon layer 74, either amorphous or polycrystalline, and a patterned dielectric layer 75 may be sequentially formed over the patterned metal layer 72. Next, a semiconductor layer 76 such as a doped amorphous silicon layer may be formed over the silicon layer 74 and the patterned dielectric layer 75. The semiconductor layer 76 may be etched to expose portions of the patterned dielectric layer 75 and the semiconductor layer 76. Next, a metal layer 77 may be formed over the semiconductor layer 76, which may fill the exposed portions of the semiconductor layer 76 to form source and drain contacts. The metal layer 77 may serve as a top electrode for the third capacitor $C_3$. Furthermore, third resistor $R_3$ may include a transistor structure similar to that of the photosensitive transistor 24-1.

FIG. 7B is a top view of a layout diagram of the photo detector array 70 illustrated in FIG. 7A. Referring to FIG. 7B, vias 78 may be formed to electrically couple the drain and gate of the photosensitive transistor 24-1. In the present example, the switching transistor 24-2 and the switching TFT 79 have a gate common to one another. In other examples, however, the switching transistor 24-2 may have a gate separated from that of the switching TFT 79. Skilled persons in the art will understand that a voltage provided by the current-to-voltage converter such as the converter 61-K to the readout circuit may be adjusted by changing the parameters such as the drain voltage of the photosensitive transistor 24-1, the dimensions each of the photosensitive transistor 24-1, switching transistor 24-2, third resistor $R_3$ and third capacitor $C_3$ such as the channel length, channel width and gate oxide thickness thereof.

FIG. 8A is a cross-sectional view of portions of a photo detector array 80 consistent with another example of the present invention. Referring to FIG. 8A, the photo detector array 80 may be similar to the photo detector array 70 illustrated in FIG. 7A except that, for example, the resistor $R'_3$ replaces resistor $R_3$. The resistor $R'_3$ may include a diffused resistor formed by the amorphous silicon layer 74 defined between related source and drain contacts. FIG. 8B illustrates a top view of a layout diagram of the photo detector array 80 with an RC network including the resistor $R'_3$ and the capacitor $C_3$.

It will be appreciated by those skilled in the art that changes could be made to one or more of the examples described above without departing from the broad inventive concept thereof. It is understood, therefore, that this invention is not limited to the particular examples disclosed, but it is intended to cover modifications within the scope of the present invention as defined by the appended claims.

Further, in describing certain illustrative examples of the present invention, the specification may have presented the method and/or process of the present invention as a particular sequence of steps. However, to the extent that the method or process does not rely on the particular order of steps set forth herein, the method or process should not be limited to the particular sequence of steps described. As one of ordinary skill in the art would appreciate, other sequences of steps may be possible. Therefore, the particular order of the steps set forth in the specification should not be construed as limitations on the claims. In addition, the claims directed to the method and/or process of the present invention should not be limited to the performance of their steps in the order written, and one skilled in the art can readily appreciate that the sequences may be varied and still remain within the spirit and scope of the present invention.

I claim:

1. A photo detector device configured for use with a display device, the photo detector device comprising:
   a photosensitive transistor formed on a substrate of the display device, the photosensitive transistor being capable of detecting an optical signal and converting the optical signal into a current signal;
   a converter formed on the substrate of the display device, the converter being capable of receiving the current signal on a first conductive line and converting the current signal into a voltage signal, the voltage signal being used to determine the position of an optical source, the converter comprising:
      a first resistive device coupled between the first conductive line and a reference voltage line, wherein the first resistive device includes a first transistor, the first transistor including a gate coupled to the first conductive line, a drain coupled to the first conductive line, and a source coupled to the reference voltage line; and
      a first capacitive device coupled in parallel with the first resistive device between the first conductive line and the reference voltage line.

2. The device of claim 1, wherein the photosensitive transistor includes a gate coupled to a second conductive line, and a source coupled to the first conductive line, the first conductive line and the second conductive line being orthogonal to one another.

3. The device of claim 1 further comprising a switching transistor capable of driving the photosensitive transistor.

4. The device of claim 3, wherein the switching transistor includes a gate connected with a gate of a switching transistor of the display device.

5. The device of claim 3, wherein the switching transistor includes a gate coupled to a second conductive line and a source coupled to the first conductive line, the first conductive line and the second conductive line, the first conductive line and the second conductive line being orthogonal to one another.

6. The device of claim 5, wherein the photosensitive transistor includes a gate coupled to a voltage source, a drain coupled to the voltage source, and a source coupled to a drain of the switching transistor.

7. The device of claim 3, wherein the switching transistor includes a gate coupled to a second conductive line and a drain coupled to a voltage source, the second conductive line and the first conductive line being orthogonal to one another.

8. The device of claim 7, wherein the photosensitive transistor includes a gate coupled to a source of the switching transistor, and a source coupled to the first conductive line.

9. The device of claim 1, wherein the first resistive device includes a first metal region electrically coupled to the first conductive line, a second metal region electrically coupled to the reference voltage line, and a first amorphous silicon region defined between the first metal region and the second metal region.

10. The device of claim 1, wherein the converter further comprises a second resistive device, the second resistive device including a third metal region electrically coupled to the source of the transistor, a fourth metal region electrically coupled to the reference voltage line, and a second amorphous silicon region defined between the third metal region and the fourth metal region.

11. The device of claim 1, wherein the converter further comprises a second transistor, the second transistor including a gate coupled to the first conductive line, and a source coupled to a circuit that determines the position of the optical source.

12. The device of claim 11, wherein the converter further comprises a third transistor, the third transistor including a gate coupled to the source of the second transistor, a drain coupled to the source of the second transistor, and a source coupled to the reference voltage line.

13. A photo detector device configured for use with a display device, the photo detector device comprising:
a plurality of first conductive lines extending in parallel with each other;
a plurality of second conductive lines extending in parallel with each other and being orthogonal to the plurality of first conductive lines;
an array of photosensitive transistors formed on a substrate of the display device, each of the photosensitive transistors being disposed near one of the plurality of first conductive lines and one of the plurality of the second conductive lines and being capable of detecting an optical signal and converting the optical signal into a current signal;
an array of converters formed on the substrate of the display device, each of the converters being capable of receiving the current signal on one of the first conductive lines, converting the current signal into a voltage signal, the voltage signal being used to determine the position of an optical source, and comprising:
a first resistive device coupled between the first conductive line and a reference voltage line, wherein the first resistive device includes a first transistor, the first transistor including a gate coupled to the first conductive line, a drain coupled to the first conductive line, and a source coupled to the reference voltage line; and
a first capacitive device coupled in parallel with the first resistive device between the first conductive line and the reference voltage line.

14. The device of claim 13, further comprising a circuit including a multiplexer capable of selecting a voltage signal from one of the converters.

15. The device of claim 14, wherein the circuit includes an amplifier circuit capable of amplifying a voltage signal from the multiplexer, and an analog-to-digital converter for converting the voltage signal into a digital signal.

16. The device of claim 15, wherein the circuit includes a processor capable of calculating the coordinates of an optical source based on the digital signal.

17. The device of claim 13, wherein the first resistive device includes a first metal region electrically coupled to the first conductive line, a second metal region electrically coupled to the reference voltage line, and a first amorphous silicon region defined between the first metal region and the second metal region.

18. The device of claim 17, wherein each of the converters further comprises a transistor, the transistor including a gate coupled to the first conductive line, and a source coupled to a circuit that determines the position of the optical source.

19. The device of claim 18, wherein each of the converters further comprises a second resistive device, the second resistive device including a third metal region electrically coupled to the source of the transistor, a fourth metal region electrically coupled to the reference voltage line, and a second amorphous silicon region defined between the third metal region and the fourth metal region.

20. The device of claim 13, wherein each of the converters further comprises a second transistor, the second transistor including a gate coupled to the first conductive line, a drain coupled to the first conductive line, and a source coupled to the circuit.

21. The device of claim 20, wherein each of the converters further comprises a third transistor, the third transistor including a gate coupled to the source of the second transistor, a drain coupled to the source of the second transistor, and a source coupled to the reference voltage line.

22. A photo detector device configured for use with a display device, the photo detector device comprising:
a photosensitive transistor formed on a substrate of the display device, the photosensitive transistor being capable of detecting an optical signal and converting the optical signal into a current signal;
a switching transistor formed on the substrate of the display device, the switching transistor being capable of driving the photosensitive transistor and being disposed near an intersection of a first conductive line and a second conductive line, the first conductive line and the second conductive line being orthogonal to one another; and
a converter formed on the substrate of the display device, the converter being capable of receiving the current signal on the first conductive line and converting the current signal into a voltage signal, the voltage signal being used to determine the position of an optical source, the converter comprising:
a first resistive device coupled between the first conductive line and a reference voltage line, wherein the first resistive device includes a first transistor, the first transistor including a gate coupled to the first conductive line, a drain coupled to the first conductive line, and a source coupled to the reference voltage line; and
a first capacitive device coupled in parallel with the first resistive device between the first conductive line and the reference voltage line.

23. The device of claim 22, wherein the switching transistor includes a gate connected with a gate of a switching transistor of the display device.

24. The device of claim 22, wherein the switching transistor includes a gate coupled to the second conductive line and a source coupled to the first conductive line.

25. The device of claim 24, wherein the photosensitive transistor includes a gate coupled to a voltage source, a drain coupled to the voltage source, and a source coupled to a drain of the switching transistor.

26. The device of claim 22, wherein the switching transistor includes a gate coupled to the second conductive line and a drain coupled to a voltage source.

27. The device of claim 26, wherein the photosensitive transistor includes a gate coupled to a source of the switching transistor, a drain coupled to the source of the switching transistor, and a source coupled to the first conductive line.

* * * * *